(12) United States Patent
Naughton et al.

(10) Patent No.: US 6,344,861 B1
(45) Date of Patent: *Feb. 5, 2002

(54) GRAPHICAL USER INTERFACE FOR DISPLAYING AND MANIPULATING OBJECTS

(75) Inventors: Patrick J. Naughton, Palo Alto; Charles H. Clanton, III, San Franciso; James A. Gosling, Woodside; Chris Warth, San Francisco; Joseph M. Palrang, Sunnyvale; Edward H. Frank, Portola Valley; David A. La Valle, Palo Alto, all of CA (US); R. Michael Sheridan, Oakton, CT (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/628,300

(22) Filed: Jul. 28, 2000

Related U.S. Application Data

(60) Continuation of application No. 08/406,578, filed on Mar. 20, 1995, now Pat. No. 6,160,551, which is a division of application No. 08/067,574, filed on Mar. 24, 1993, now abandoned.

(51) Int. Cl.[7] .................................................. G06F 3/00
(52) U.S. Cl. ...................................... 345/769; 345/839
(58) Field of Search ................................ 345/339, 348, 345/333, 347, 342, 349, 335, 358, 145, 156, 169, 173, 764, 769, 770, 856, 765, 768, 835, 839, 744, 808, 809, 788, 799, 861, 859, 860, 863, 727, 978

(56) References Cited

U.S. PATENT DOCUMENTS 4,290,142 A  9/1981 Schnee et al. .............. 725/126
4,533,910 A  8/1985 Sukonick et al. ........... 345/806

(List continued on next page.)

FOREIGN PATENT DOCUMENTS

EP  0 239 884  10/1987
EP  0 438 017  7/1991

(List continued on next page.)

OTHER PUBLICATIONS

Alexander, "Visualizing Cleared–Off Desktops," Computerworld, May 6, 1991, p. 20.

Jeffrey J. Blatt, "A Primer on User Interface Software Patents," 9 The Computer Lawyer, vol. 9, No. 4, Apr. 1992.

(List continued on next page.)

Primary Examiner—Crescelle N. dela Torre
(74) Attorney, Agent, or Firm—Finnegan, Henderson, Farabow, Garrett & Dunner LLP

(57) ABSTRACT

An intuitive graphical user interface is based upon a geographic map structure, and includes a system for controlling remote external electronic devices. In the defined graphical user interface, each Space of the geographic map structure is rendered on a touch screen display as a graphic image of a geographic space. Within each Space are colored cartoon-like icons called "objects" which can be Selected and manipulated by the user. Certain objects, referred to as portals, transport the user from one Space to another Space when Selected. Other objects, referred to as buttons, perform associated actions or functions when Selected. The graphical user interface is displayed on a hand-held display device used to control remote devices. Each remote electronic device transmits a user interface program object that defines a graphical user interface to the display device. The hand-held display devices displays the graphical user interface associated with the remote device when a user selects an icon associated with the remote device on the display device's touch screen display.

13 Claims, 26 Drawing Sheets

U.S. PATENT DOCUMENTS

| | | | | |
|---|---|---|---|---|
| 4,536,791 | A | 8/1985 | Campbell et al. | 725/28 |
| 4,555,775 | A | 11/1985 | Pike | 345/790 |
| 4,573,072 | A | 2/1986 | Freeman | 725/136 |
| 4,622,545 | A | 11/1986 | Atkinson | 345/562 |
| 4,641,205 | A | 2/1987 | Beyers, Jr. | 386/83 |
| 4,653,090 | A | 3/1987 | Hayden | 379/204.01 |
| 4,706,121 | A | 11/1987 | Young | 348/27 |
| 4,712,191 | A | 12/1987 | Penna | 345/853 |
| RE32,632 | E | 3/1988 | Atkinson | 345/165 |
| 4,748,618 | A | 5/1988 | Brown et al. | 370/419 |
| 4,750,036 | A | 6/1988 | Martinez | 725/62 |
| 4,772,882 | A | 9/1988 | Mical | 345/823 |
| 4,785,408 | A | 11/1988 | Britton et al. | 704/270 |
| 4,788,538 | A | 11/1988 | Klein et al. | 345/418 |
| 4,812,834 | A | 3/1989 | Wells | 345/790 |
| 4,847,604 | A | 7/1989 | Doyle | 345/180 |
| 4,847,700 | A | 7/1989 | Freeman | 386/99 |
| 4,873,623 | A | 10/1989 | Lane et al. | 700/83 |
| 4,884,223 | A | 11/1989 | Ingle et al. | 702/41 |
| 4,890,320 | A | 12/1989 | Monslow et al. | 380/211 |
| 4,899,136 | A | 2/1990 | Beard et al. | 345/156 |
| 4,914,517 | A | 4/1990 | Duffield | 725/57 |
| 4,914,732 | A | 4/1990 | Henderson et al. | 340/3.71 |
| 4,931,783 | A | 6/1990 | Atkinson | 345/163 |
| 4,935,865 | A | 6/1990 | Rowe et al. | 700/83 |
| 4,939,507 | A | 7/1990 | Beard et al. | 345/156 |
| 4,959,720 | A | 9/1990 | Duffiled et al. | 725/57 |
| 4,977,455 | A | 12/1990 | Young | 348/460 |
| 4,987,486 | A | 1/1991 | Johnson et al. | 725/131 |
| 4,995,078 | A | 2/1991 | Monslow et al. | 380/240 |
| 5,008,853 | A | 4/1991 | Bly et al. | 345/751 |
| 5,014,125 | A | 5/1991 | Pocock et al. | 725/93 |
| 5,021,976 | A | 6/1991 | Wexelblat et al. | 345/853 |
| 5,047,867 | A | 9/1991 | Strubbe et al. | 386/83 |
| 5,062,060 | A | 10/1991 | Kolnick | 345/800 |
| 5,065,347 | A | 11/1991 | Pajak et al. | 345/835 |
| 5,072,412 | A | 12/1991 | Henderson, Jr. et al. | 345/804 |
| 5,086,385 | A | 2/1992 | Launey et al. | 700/83 |
| 5,093,718 | A | 3/1992 | Hoarty et al. | 725/120 |
| 5,107,443 | A | 4/1992 | Smith et al. | 345/751 |
| 5,140,677 | A | 8/1992 | Fleming et al. | 345/835 |
| 5,140,678 | A | 8/1992 | Torres | 345/777 |
| 5,146,556 | A | 9/1992 | Hullot et al. | 345/790 |
| 5,148,154 | A | 9/1992 | MacKay et al. | 345/782 |
| 5,151,782 | A | 9/1992 | Ferraro | 725/66 |
| 5,151,789 | A | 9/1992 | Young | 725/133 |
| 5,155,806 | A | 10/1992 | Hoeber et al. | 345/711 |
| 5,157,768 | A | 10/1992 | Hoeber et al. | 345/711 |
| 5,177,604 | A | 1/1993 | Martinez | 725/144 |
| 5,195,092 | A | 3/1993 | Wilson et al. | 725/146 |
| 5,204,947 | A | 4/1993 | Bernstein et al. | 345/854 |
| 5,206,722 | A | 4/1993 | Kwan | 725/100 |
| 5,220,420 | A | 6/1993 | Hoarty et al. | 725/119 |
| 5,223,924 | A | 6/1993 | Strubbe | 725/46 |
| RE34,340 | E | 8/1993 | Freeman | 725/78 |
| 5,233,687 | A | 8/1993 | Henderson, Jr. et al. | 345/804 |
| 5,235,679 | A | 8/1993 | Yoshizawa et al. | 345/709 |
| 5,236,199 | A | 8/1993 | Thompson, Jr. | 463/41 |
| 5,239,540 | A | 8/1993 | Rovira et al. | 370/345 |
| 5,241,671 | A | 8/1993 | Reed et al. | 707/104.1 |
| 5,247,347 | A | 9/1993 | Litteral et al. | 725/114 |
| 5,253,067 | A | 10/1993 | Chaney et al. | 348/570 |
| 5,295,062 | A | 3/1994 | Fukushima | 700/83 |
| 5,295,243 | A | 3/1994 | Robertson et al. | 345/848 |
| 5,297,253 | A | 3/1994 | Meisel | 345/850 |
| 5,310,349 | A | 5/1994 | Daniels et al. | 434/350 |
| D348,654 | S | 7/1994 | Branck et al. | D14/343 |
| 5,327,160 | A | 7/1994 | Asher | 345/156 |
| 5,327,161 | A | 7/1994 | Logan et al. | 345/157 |
| 5,333,254 | A | 7/1994 | Robertson | 345/853 |
| 5,333,256 | A | 7/1994 | Greem et al. | 345/772 |
| 5,347,628 | A | 9/1994 | Brewer et al. | 345/775 |
| 5,349,658 | A | 9/1994 | O'Rourke et al. | 345/839 |
| 5,357,276 | A | 10/1994 | Banker et al. | 725/102 |
| 5,361,091 | A | 11/1994 | Hoarty et al. | 725/119 |
| 5,363,482 | A | 11/1994 | Victor et al. | 345/804 |
| 5,367,454 | A | 11/1994 | Kawamoto et al. | 345/706 |
| 5,371,553 | A | 12/1994 | Kawamura et al. | 725/59 |
| 5,377,997 | A | 1/1995 | Wilden et al. | 463/43 |
| 5,381,158 | A | 1/1995 | Takahara et al. | 345/156 |
| 5,388,993 | A | 2/1995 | McKiel et al. | 434/118 |
| 5,392,389 | A | 2/1995 | Fleming | 345/349 |
| 5,393,073 | A | 2/1995 | Best | 463/35 |
| 5,394,521 | A | 2/1995 | Henderson, Jr. et al. | 345/804 |
| 5,396,546 | A | 3/1995 | Remillard | 379/93.24 |
| 5,397,678 | A | 3/1995 | Sato et al. | 430/258 |
| 5,410,326 | A | 4/1995 | Goldstein | 348/734 |
| 5,412,377 | A | 5/1995 | Evans et al. | 340/825.22 |
| 5,416,901 | A | 5/1995 | Torres | 345/835 |
| 5,422,993 | A | 6/1995 | Fleming | 345/835 |
| 5,428,734 | A | 6/1995 | Haynes et al. | 345/769 |
| 5,434,965 | A | 7/1995 | Matheny et al. | 345/710 |
| 5,442,376 | A | 8/1995 | Tannebaum et al. | 345/156 |
| 5,442,742 | A | 8/1995 | Greyson et al. | 707/539 |
| 5,457,478 | A | 10/1995 | Frank | 345/158 |
| 5,461,710 | A | 10/1995 | Bloomfield et al. | 345/839 |
| 5,463,725 | A | 10/1995 | Henckel et al. | 345/776 |
| 5,463,726 | A | 10/1995 | Price | 345/797 |
| 5,485,197 | A | 1/1996 | Hoarty | 725/37 |
| 5,491,743 | A | 2/1996 | Shiio et al. | 709/204 |
| 5,491,784 | A | 2/1996 | Douglas et al. | 345/810 |
| 5,500,794 | A | 3/1996 | Fujita et al. | 700/83 |
| 5,517,663 | A | 5/1996 | Kahn | 345/473 |
| 5,524,195 | A | 6/1996 | Clanton, III et al. | 725/61 |
| 5,530,865 | A | 6/1996 | Owens et al. | 709/313 |
| 5,543,857 | A | 8/1996 | Wehmeyer et al. | 348/589 |
| 5,555,354 | A | 9/1996 | Strasnick et al. | 345/427 |
| 5,561,444 | A | 10/1996 | Johnston, Jr. et al. | 345/145 |
| 5,638,505 | A | 6/1997 | Hemenway et al. | 345/769 |
| 5,657,221 | A | 8/1997 | Warman et al. | 700/83 |
| 5,666,552 | A | 9/1997 | Greyson et al. | 707/539 |
| 5,689,663 | A | 11/1997 | Williams | 345/721 |
| 5,694,151 | A | 12/1997 | Johnston, Jr. et al. | 345/860 |
| 5,754,178 | A | 5/1998 | Johnston, Jr. et al. | 345/769 |
| 5,886,697 | A | 3/1999 | Naughton et al. | 345/473 |
| 5,995,106 | A | 11/1999 | Naughton et al. | 345/854 |

FOREIGN PATENT DOCUMENTS

| | | |
|---|---|---|
| EP | 0 439 873 | 8/1991 |
| EP | 0 524 103 | 1/1993 |
| WO | 93/11639 | 11/1992 |

OTHER PUBLICATIONS

P. Chan, "Learning Considerations in User Interface Design: The Room Model," Report CS–84–16, University. of Waterloo, Computer Science Dept, Waterloo, Ontario, Canada, Jul., 1984.

Stavros Christodoulakis et al., "Browsing Within Time–Driven Multimedia Documents," Institute for Computer Research, University of Waterloo, Waterloo, Ontario, Canada, Jul., 1988.

Chung et al., "A 'Tiny' Pascal Compiler; the P–Code Interpreter," BYTE Publications Inc., Sep., 1978.

Chung et al., "A 'Tiny' Pascal Compiler Part 2: The P–Compiler," BYTE Publications Inc., Oct., 1978.

Conference Proceeding, the 10$^{th}$ Annual International Symposium on Computer Architecture, Royal Institute of Technnology, Stockholm, Sweden, 1983.

Hoarty, "Multimedia on Cable Television Systems," Oct. 5, 1993, pp. 555–567.

Hsia et al., "Construction and Manipulation of Dynamic Icons," IEEE 78, 1988.

(IBM), "Conferencing Metaphor," Feb 2, 1993, pp. 63–66.

IBM Technical Disclosure Bulletin, "Creation/Modification of the Audio Signal Processor Setup for a PC Audio Editor," vol. 30, No. 10, Mar., 1988.

IBM Technical Disclosure Bulletin, vol. 34, No. 5, pp. 24–26, Oct. 5, 1991.

IBM Tecnical Disclosure Bulletin, vol. 36, No. 4, pp. 215–216, Apr., 1993.

Hiroshi Ishiii et al., "Clearface: Translucent Multiuser Interface for TeamWork Station," ECSCW, Sep., 1991, pp. 6–10.

Hiroshi Ishii et al., "Toward an Open Shared Workspace," Communications of the ACM, vol. 34, No. 12, Dec., 1991, pp. 37–50.

B. Laurel, "Computers as Theater," Addison Wesley Pub. Co., 1990.

B. Laurel, "Computers as Theater," Addison Wesley Pub. Co., 1993.

B. Laurel. "The Art of Human–Computer Interface Design," Addison Wesley Pub. Co., 1990.

B. Laurel, "The Art of Human Computer Interface Design," Apple Computer Inc., 1991.

Gene McDaniel, "An Analysis of a Mesa Instruction Set," Palo Alto Research Centers, 1982.

Brad A. Meyers, "The Importance of Percent–Done Progress Indicators for Computer–Human Interfaces," ACM 11, 1989.

Mitchell et al., "Mesa Language Manual," Palo Alto Research Centers.

Kenneth A. Pier, "A Retrospective on the Dorado, A High–Performance Personal Computer,"Palo Alto Research Centers, Aug., 1983.

George Robertson et al., Communication for the Assoc. for Computing Machinery, "Information Visualization Using 3D Interactive Animation," vol. 36, No. 4, Apr., 1993, pp. 57–71.

George Robertson et al., UIST Proceedings of the ACM Siggraph Symposium on User Interface Software and Technology, "The Cognitive Coprocessor Architecture for Interactive User Interfaces," Nov., 13–15, 1989, Williamsburg, VA. pp. 10–18.

Sega of America, "Sonic the Hedgehog," 1991.

Tanigawa, "Personal Multimedia–Multipoint Teleconference System," Apr. 7, 1991, pp. 1127–1144.

Thompson, "Regular Expression Search Algorithm" Communications of the ACM, vol. 11, No. 6, Jun. 1968 at 418 et seq.

Y, Tonomura et al., "Content Oriented Interface Using Video Icons for Visual Database Systems," IEEE 68, 1989.

Hirotada Ueda et al., "Impact: An Interactive Natural–Motion–Picture Dedicated Multi–Media Authoring System," Communications of the ACM, Mar., 1991, pp. 343–350.-

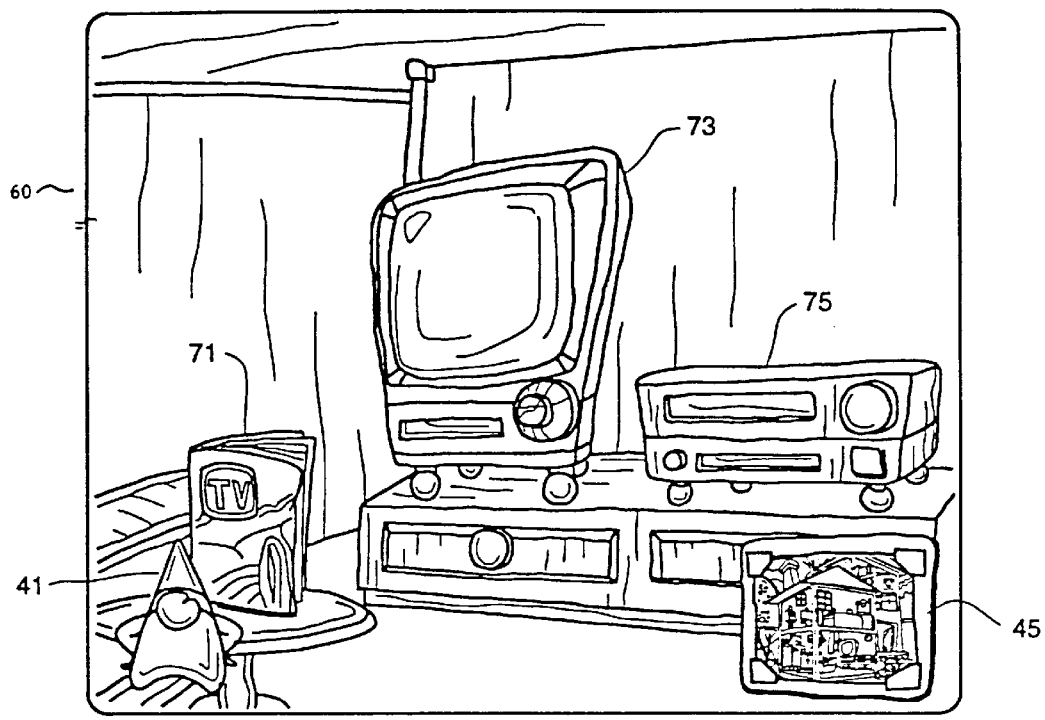
FIG_7
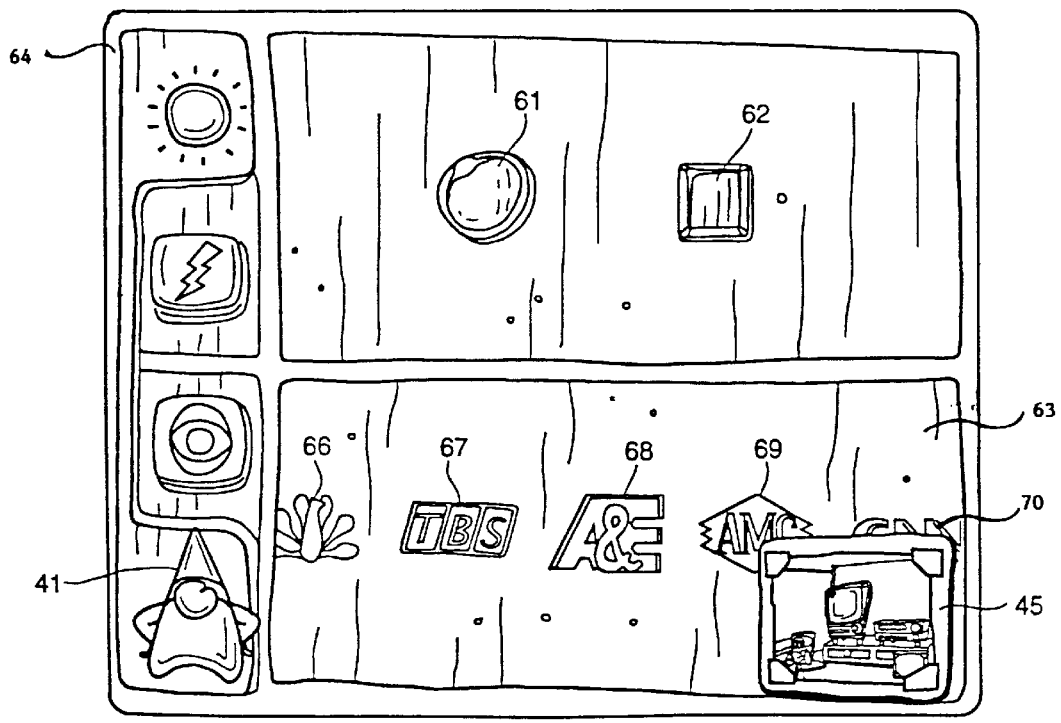
FIG_8

GRAPHICAL USER INTERFACE FOR DISPLAYING AND MANIPULATING OBJECTS

This is a continuation division of application Ser. No. 08/406,578, filed Mar. 20, 1995, which is a divisional application of application Ser. No. 08/067,574, filed Mar. 24, 1993, now abandoned, all of which are incorporated herein by reference.

BACKGROUND OF THE INVENTION

1. Field of the Invention

The present invention relates to the field of graphical user interfaces for computer systems and, more particularly, to a method and apparatus for providing an intuitive methodology for an operator to control remote devices with a computer controlled object-oriented user interface utilizing animated graphic images.

2. Art Background

Most popular graphical user interfaces that are available today, such as the Xerox Star®, Apple Macintosh®, and Microsoft Windows graphical user interfaces, are based upon the "desktop metaphor." In a desktop metaphor system, the display screen is treated as a virtual desktop. Graphical symbols placed on the virtual desktop (i.e. the display screen) are used to represent common objects found in an office environment such as files, file folders, and printers. These desktop metaphor systems have several limitations which hamper the effectiveness of the man-machine interface between the human operator and the computer system.

One problem with the existing desktop metaphor graphical user interfaces is the use of a hierarchical file system. Most desktop metaphor graphical user interfaces are based upon a computer having a file system in which the computer files are organized in a hierarchical structure. The hierarchical file system structure has a root directory and several sub-directories within the root directory. Each sub-directory may have sub-sub-directories, and so on. The hierarchical file system structure is graphically illustrated on the screen as some type of root file cabinet with file folders inside. The Microsoft Windows and Apple Macintosh® operating systems both use hierarchical file systems illustrated as file folders.

The hierarchical structure of file folders is often very confusing to new users. For example, many users get lost while navigating through hierarchical file systems because the system of keeping files in file folders, which are in other file folders nested to an arbitrary depth is inherently confusing. Users become lost because each file folder looks like every other file folder, and the user is provided with little feedback as to his location within the file system hierarchy. Also, each file folder provides no information as to what the file folder contains other than a user-defined label. For example, except for a short text label, which may have been defined by another user, the user generally is not able to determine whether an open folder is an accounting file folder containing spreadsheet data, or a data base file folder containing a customer data base. Therefore, navigating through the complex file system hierarchy is difficult since the current desktop metaphor graphical user interface offers little feedback as to a user's location within the file hierarchy.

In current graphical user interface systems based upon the desktop metaphor, certain applications often do not fit well into a desktop metaphor environment conceptually. Specifically, non-office related applications may be inappropriate for a system based upon the desktop metaphor. For example, in a desktop metaphor, an application that controls a television would have to be placed into a "paper" file folder on the desktop.

Another common problem with desktop metaphor user interfaces is that displaying a large number of applications on the desktop results in a cluttered desktop. Many users of desktop metaphor systems keep large numbers of applications and files, usually in icon form, on the display screen. Some attempt is made to use a graphical representation that identifies the type of application or file. However, when a user wishes to open a particular application or file, the user must search the display screen to find the desired icon just as if the user were trying to find a particular paper file on a messy desktop. Icons placed the desktop have no apparent hierarchy, and are all equal. This equality may confuse a user, and may create problems when the user wants to switch from one task to another.

Several systems have evolved to improve the organization of the desktop metaphor graphical user interface. One system is the concept of "Rooms". See, Patrick Chan, "Learning Considerations in User Interface Design: The Room Model", Report CS-84-16, University of Waterloo Computer Science Department, Ontario, Canada, July, 1984; Brenda Laurel, "Computers as Theatre", Addison-Wesley Publishing Co., 1991; Brenda Laurel, "The Art of Human-Computer Interface Design", Addison-Wesley Publishing Co., 1990; U.S. Pat. No. 5,072,412, Henderson, Jr. et al., "User Interface with Multiple Workspaces for Sharing Display System Objects", and the references cited therein.

In systems based upon the Rooms concept, the user creates different rooms where the user performs a single task or a group of related tasks. Each room represents an individual virtual desktop with a group of associated tasks. Each room is given a label that identifies the room with the room's functions. For example, a user may create a mail room, a typing room with a word processor, and an accounting room with a spreadsheet. Each room has only those icons and windows that are associated with the particular task of the room, as well as any windows shared by all rooms, such as a clock.

To switch between tasks in a system that uses the Rooms concept, a user moves between the different rooms that are associated with the different tasks. For example, to go from a spreadsheet to retrieve email, a user moves from the accounting room to the mail room. To move between the two rooms, a user selects an icon that represents a door connecting the current room to the other room. Users can create doors between any of the available rooms.

Although the Rooms concept helps solve the problem of the "cluttered desktop," the Rooms concept still relies upon the common desktop metaphor. For example, the Rooms interface concept does not help simplify the confusing hierarchical file structure used to store information. The Rooms concept also does little to solve the form and function inconsistencies that are apparent when applications which do not fit into the desktop metaphor are added to the system.

In prior art graphical user interfaces, each time a new piece of hardware is introduced to the system a new piece of control software must also be added by the user. For example, if a user of an Apple® Macintosh® or a user of Microsoft® Windows desires to add a new printer to the system, the user must also install a new printer driver to control the added printer. Therefore, each time a user desires to add a new device to the system, the user must also follow a complicated procedure to add the appropriate software.

As will be described, the present invention provides an improved graphical user interface that overcomes several of the problems associated with desktop metaphor systems. A method and apparatus for obtaining the user interface of a remote device without requiring the user to load the related software is also disclosed. The remote device can be controlled using the remote device's user interface as displayed on the present invention's display screen. Although the user interface is described with reference to the control of remote devices, it will be appreciated from the discussion that follows that the user interface may be applied to a variety of applications in computer workstations, portable computers, and hand held control systems.

SUMMARY OF THE INVENTION

The present invention provides an intuitive graphical user interface and a method and apparatus for controlling remote devices. The graphical user interface of the present invention is displayed on a hand-held display device. The hand-held display device comprises at least one central processing unit (CPU) coupled to a graphic display system. In the present embodiment, the graphic display system is touch sensitive to permit the user to input information using a fingertip without the need for additional input devices such as a keyboard. A communications circuit is also coupled to the CPU transmitting information over some communication medium. The communications circuit is used to control and to communicate with remote devices.

The graphical user interface of the present invention creates a world of Spaces organized into a geographic map structure that is simple to navigate through since each Space provides familiar geographic surroundings. Each Space is represented by a background image which provides navigational landmarks that identify where the Space is located within the geographic map structure. For example, the background image of a living room Space contains items typically found in a living room such as a lamp, a chair, and a table. Therefore, navigation through this "world" is made easier because the user can orient himself by looking around and examining the surroundings just as a person would do in the real world.

Within each Space, the user interface provides graphic objects that can be selected and manipulated by the user. The graphic objects are rendered as animated cartoon-like graphic objects that are easily identifiable as real world objects such as televisions and VCRs. There are at least three types of objects that exist in the Spaces of the user interface: data objects, buttons, and portals. Data objects are objects that are associated with a particular piece of data. Buttons are objects that are associated with a particular function or action; when a user selects a button, the user interface performs the function or action associated with the button. Portals are objects that are displayed in a first Space but are associated with a second Space; when a user selects a portal the user passes through the portal and moves to the second Space associated with that portal. The user environment is further enhanced by the use of sound, coordinated with every user action and supplementing the visual feedback provided.

To control real world remote devices, many of the graphic objects presented on the screen are associated with remote devices in the real world. To control a remote device, a user selects the graphic object pictured on the display screen associated with the particular remote device. After the user selects a graphic object associated with a remote device, the hand-held display device displays a user interface for controlling the remote device. The user can then interact with the remote device's user interface. To control the remote device, the present invention invokes a device driver method for the remote device. The device driver method may be located within the remote device or within the local hand-held display device, depending on the remote device's sophistication.

BRIEF DESCRIPTION OF THE DRAWINGS

The objects, features and advantages of the present invention will be apparent to one skilled in the art, in view of the following detailed description in which:

FIG. 7 illustrates a view of a living room Space in the user interface based upon the geographic map structure in FIGS. 2b and 2c.

FIG. 8 illustrates a view of a television Space in the user interface based upon the geographic map structure in FIGS. 2b and 2c.

NOTATION AND NOMENCLATURE

Figure 1A:
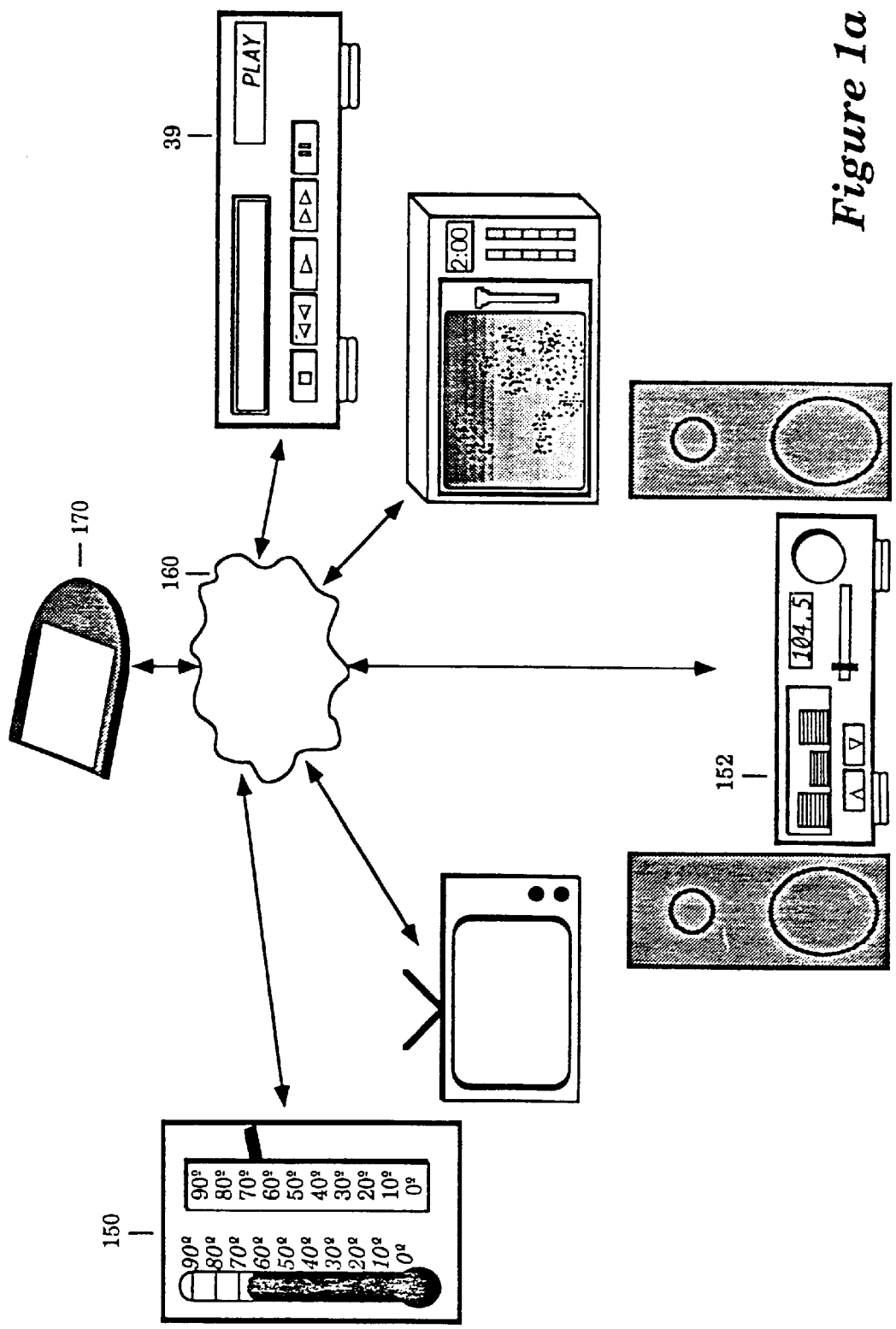
FIG. 1a illustrates an overview of the remote control functionality provided by the present invention.

The detailed descriptions which follow are presented largely in terms of display images, algorithms, and symbolic representations of operations of data bits within a computer memory. These algorithmic descriptions and representations are the means used by those skilled in the data processing arts to most effectively convey the substance of their work to others skilled in the art.

An algorithm is here, and generally, conceived to be a consistent sequence of steps leading to a desired result. These steps are those requiring physical manipulations of physical quantities. Usually, though not necessarily, these quantities take the form of electrical or magnetic signals capable of being stored, transferred, combined, compared, selected, chosen, modified, and otherwise manipulated. It proves convenient at times, principally for reasons of common usage, to refer to these signals as bits, values, elements, symbols, characters, images, terms, numbers, or the like. It should be borne in mind, however, that all of these, as well as similar terms, are to be associated with the appropriate physical quantities and are merely convenient labels applied to these quantities.

In the present case, the operations are machine operations performed in conjunction with a human operator. Useful machines for performing the operations of the present invention include general purpose digital computers or other similar devices. In all cases, the distinction between the method operations of operating a computer and the method of computation itself should be kept in mind. The present invention relates to method steps for operating a computer and processing electrical or other physical signals to generate other desired physical signals.

The present invention also relates to apparatus for performing these operations. This apparatus may be specially constructed for the required purposes or it may comprise a general purpose computer selectively activated or reconfigured by a computer program stored in the computer. The algorithms presented herein are not inherently related to any particular computer or other apparatus. In particular, various general purpose machines may be used with programs in accordance with the teachings herein, or it may prove more convenient to construct more specialized apparatus to perform the required method steps. The required structure for a variety of these machines will appear from the description given below. Machines which may perform the functions of the present invention include those manufactured by the Assignee, FirstPerson, Inc., as well as other manufacturers of computer systems, including Sun Microsystems, Inc. of Mountain View, Calif.

CODING DETAILS

No particular programming language has been indicated for carrying out the various procedures described herein. This is due in part to the fact that not all languages that might be mentioned are universally available. Each user of a particular computer will be aware of a language which is most suitable for his immediate purposes. In practice, it has proven useful to substantially implement the present invention in a high level language which is then compiled into machine executable object code. Because the computers and the monitor systems which may be used in practicing the instant invention consist of many diverse elements, no detailed program listing has been provided. It is considered that the operations and other procedures described herein and illustrated in the accompanying drawings are sufficiently disclosed to permit one of ordinary skill to practice the instant invention.

DETAILED DESCRIPTION OF THE INVENTION

A computer based remote control system with an intuitive graphical user interface is disclosed. In the following description, for purposes of explanation, specific nomenclature is set forth to provide a thorough understanding of the present invention. However, it will be apparent to one skilled in the art that these specific details are not required to practice the present invention. In other instances, well known circuits, functions, processes, and devices are shown in block diagram and conceptual diagram form in order not to obscure the present invention unnecessarily.

System Overview

FIG. 1a illustrates an overview of the computer based remote control system of the present invention. The main component of the present invention consists of a hand-held display device 170 as illustrated in FIG. 1a. In the present embodiment, the hand-held display device 170 comprises a computer system with a color graphic touch screen display. The hand-held display device 170 is designed to control any compatible remote device such as thermostat 150, video cassette recorder 39, and stereo system 152. The hand-held display device 170 communicates with the remote devices using a communications medium 160.

The remote control system of the present invention as illustrated in FIG. 1a differs significantly from prior art remote control systems since it is based upon modular object-oriented software. The object-oriented software provides features previously not available in prior art remote control systems. For example, when an operator (sometime referred to herein as a "user") adds a new compatible remote device, such as thermostat 150 to the system, the new remote device transmits information about itself to the hand-held display device 170. The transmitted information includes a user interface object that can be used to render a graphical user interface for the remote device. The present invention uses the user interface object to display a graphical user interface for the new remote device on the hand-held display device 170. The transmitted information may also include a device driver object that is used to control the new remote device. To organize all the available user interface objects, the hand-held display device 170 creates a "world" of geographic Spaces that can be easily be navigated using a set of gestures.

This Specification will first disclose the hardware required to construct the hand-held display device 170 and the compatible remote devices of the present invention. The graphical user interface comprising geographic Spaces and objects which is displayed on the hand-held display device 170 will then be described. A set of gestures used by operators to navigate around the user interface of the present invention will also be defined. To combine the user interface elements, a tour through an embodiment of the user interface of the present invention will be provided to illustrate how the navigational gestures are used to interact with the objects displayed on the hand-held display device 170. Finally, the system of obtaining information from the remote devices is defined, such that the hand-held display device 170 may communicate with and control remote external devices.

Due to the limitations of a written Specification to describe animated events on an interface, the reader is referred to a video tape entitled "Green Project User Interface," submitted by the applicant concurrently with the filing of the application on which this patent is based. In addition it must also be noted that the features of the present invention are illustrated in black and white within the accompanying figures. However, in the presently preferred embodiment, and as described below, objects and features are displayed in color.

Hardware Configuration

Figure 1B:
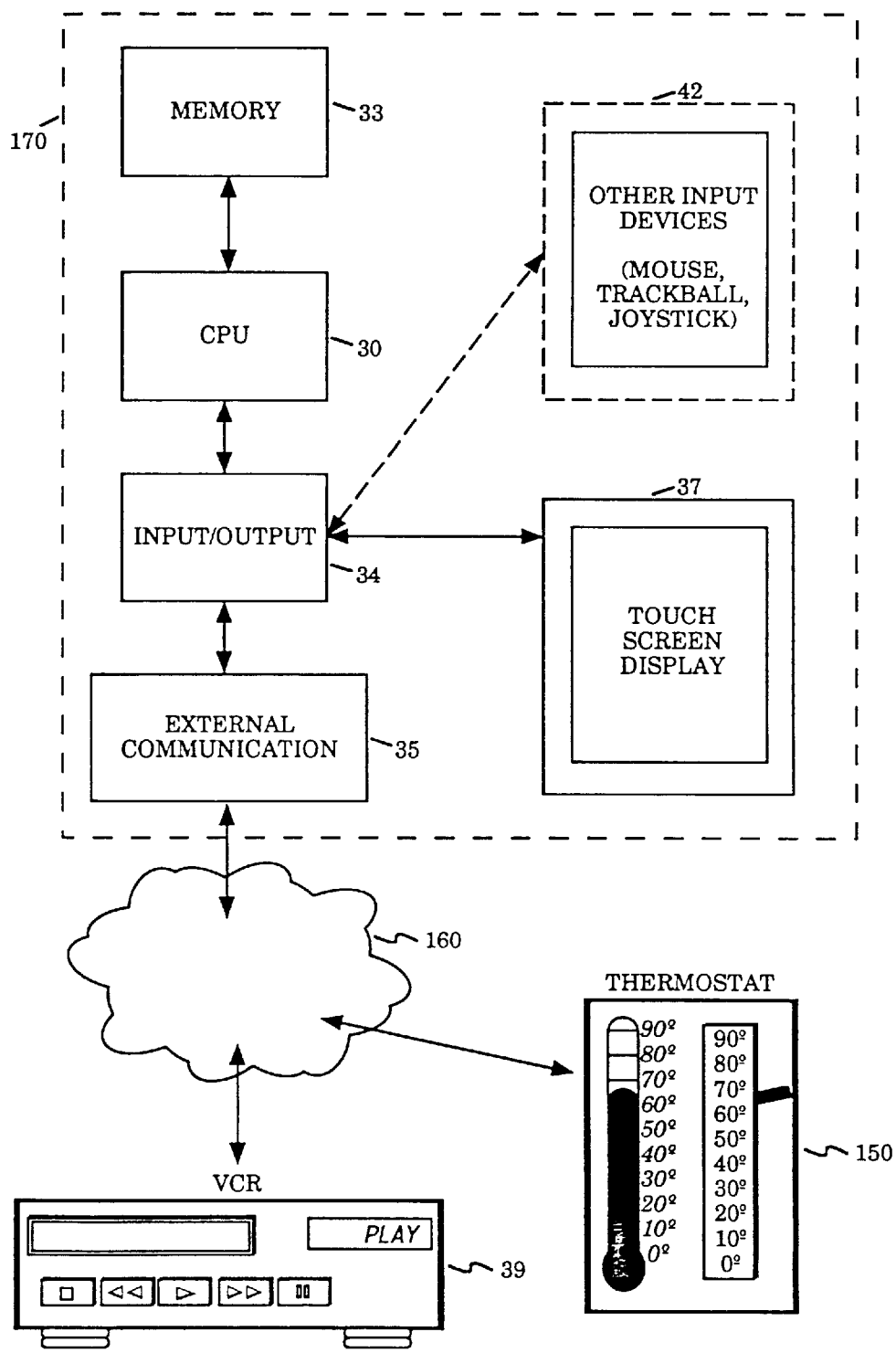
FIG. 1b illustrates an overview of the hardware used to implement the hand-held display device of the present invention.

The hand-held display device 170 of the present invention comprises a computer system, such as that illustrated in FIG. 1b. The computer system 170 of FIG. 1b includes a central processing unit (CPU) 30, a memory unit 33, and an input/output (I/O) unit 34. These elements are those typically found in most general purpose computers, and in fact, the hand-held computer system 170 is intended to be representative of a broad category of data processing devices capable of generating graphic displays.

Coupled to the input/output (I/O) unit 34 of computer system 170 is a color graphic screen display 37. The screen display 37 comprises, in part, a color raster display device such as a cathode ray tube (CRT) monitor or a liquid crystal display (LCD). The screen display 37 must be of sufficient resolution such that screen display 37 can render graphic images.

In the preferred embodiment, the screen display 37 further comprises a touch screen display system. The touch screen display includes a feature that can detect the presence of a finger touching the display screen 37. Furthermore, the touch screen can identify the precise location of the finger touching the display screen 37 such that the display screen can sense finger gestures made by a user's finger on the display screen 37. The touch screen display 37 may comprise one of a variety of touch sensitive display screens commercially available on the market.

Alternatively, the hand-held computer system 170 may be constructed with a conventional graphic display system without a touch sensitive display screen. Such a system requires an alternative input system to obtain the user's interactions. FIG. 1b illustrates an alternative input device 42. Although the user interface of the present invention may be used with alternative input devices 42 such as mice, trackballs, and joysticks, the system will be described within this specification as the preferred embodiment with a touch screen display 37.

In operation, the CPU 30 generates and displays a graphical user interface on touch screen display 37 through the execution of computer code stored in memory 33. The computer code stored in memory 33 is not disclosed herein since the description of the present invention in this Specification is sufficient for one skilled in the computer art to utilize the teachings of the invention in a variety of computer systems using one of many computer languages.

Coupled to the input/output (I/O) unit 34 of computer system 170, in FIG. 1b, is an external communication circuit 35. The external communication circuit 35 provides a system for transmitting and receiving information to and from the hand-held computer system 170. The present invention uses the external communication circuit 35 in computer system 170 to communicate with remote devices such as a video cassette recorder 39 and a thermostat 150, across communications medium 160. The communication circuit 35 may use one of many well-known communication technologies such as radio waves, low power, cellular, infrared signals, or data signals carried on existing power lines.

To be controlled by the present hand-held display device 170 of the present invention, a remote device must have at least one method for receiving information transmitted by the hand-held display device 170. Ideally, the remote devices are intelligent devices that can both transmit and receive information. However, the hand-held display device 170 can control any remote device that fits within any of the three following remote device "types".

Figure 1C:
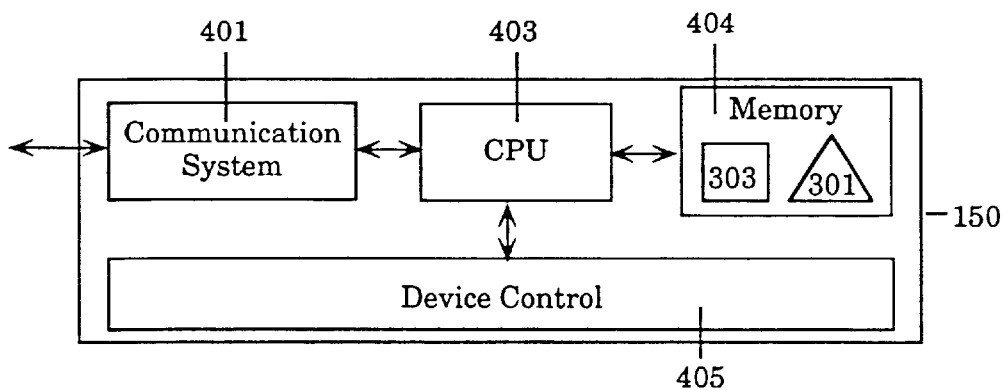
FIG. 1c illustrates a block diagram of an intelligent remote device that is controlled by the present invention.

The first type of remote device that can be controlled by the present invention is an "intelligent remote device"

specifically designed to operate with the hand-held display device 170. In the present invention, an "intelligent remote device" is defined as a remote device that contains a microprocessor, a communication system, and a memory. FIG. 1c provides a block diagram of the components in an intelligent remote device 150. As illustrated in FIG. 1c, the intelligent remote device 150 comprises a CPU 403, a memory 404, a communications circuit 401, and a device control circuitry 405.

The hand-held display device 170 of the present invention communicates with an intelligent remote device 150 through the intelligent remote device's communications circuit 401. The memory 404 stores programs and data used by the CPU 403, including a user interface object 303 and a device driver object 301. The CPU 403 in the intelligent remote device invokes methods in the device driver object 301 to control the remote device.

The second type of remote device that can be controlled by the present invention is a "simple remote device" specifically designed to operate with the hand-held display device 170. In the present invention, a remote device is defined as a "simple remote device" if the remote device does not have a microprocessor or the remote device contains such a primitive processor that the hand-held display device 170 can not invoke methods in a device driver object within the remote device.

Figure 1D:
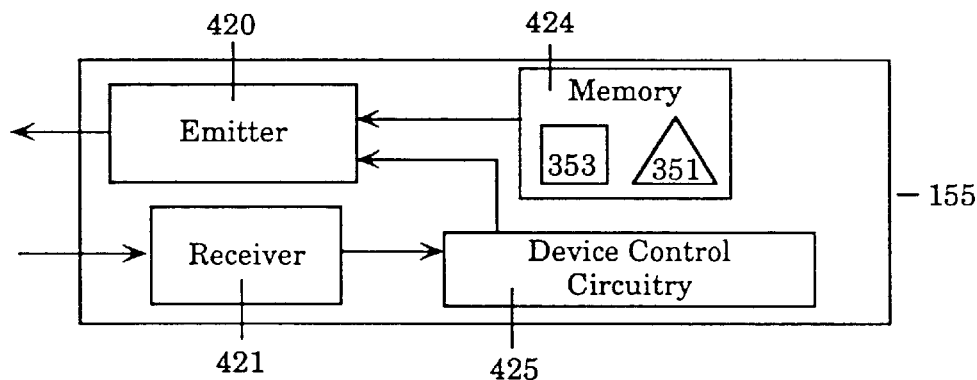
FIG. 1d illustrates a block diagram of a simple remote device that is controlled by the present invention.

FIG. 1d provides a block diagram of the components in a typical simple remote device 155. As illustrated in FIG. 1d, the simple remote device 155 comprises an emitter 420, a receiver 421, a memory 424, and device control circuitry 425. The emitter 420 in the simple remote device 155 is used to transmit the contents of the memory 424 to the hand-held display device 170. Therefore, the simple remote device 155 transmits both the user interface object 353 and the device driver object 351 in the memory 424, such that the hand-held display device receives both objects.

To control the simple remote device 155, the display device 170 invokes a method within the device driver object 351 to translate the user's interactions into simple predefined control codes. The display device 170 then transmits the simple predefined control codes to the simple remote device 155 which receives the control codes though receiver 421 and passes the information to the device control circuitry 425.

Figure 1E:
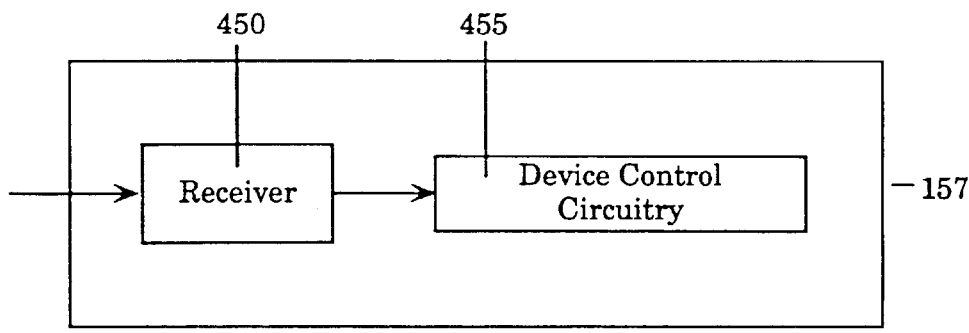
FIG. 1e illustrates a block diagram of conventional electronic device that is controlled remotely by the present invention.

Finally, the third type of remote device that can be controlled by the present invention is a conventional electronic device that can be controlled by transmitted signals such as infrared signals. Therefore, the present invention is backward compatible with most existing devices that can be controlled remotely. FIG. 1e illustrates a typical electronic device 157 that can be controlled by coded signals. The device has a receiver 450 for receiving transmitted coded control signals and device control circuitry 455 for responding to the coded control signals. The hand-held display device 170 controls the electronic device 157, by transmitting coded control signals. The remote electronic device 157 receives the transmitted signals and responds accordingly.

The Display Device User Interface

In order to create a new product that is easy to use, product designers attempt to make the new product operate in a manner similar to an old product that the intended operator already knows how to operate. For example, audio cassette tape recorders have been available for such a long time that most people know how to operate an audio cassette tape recorder. The play, stop, rewind, fast-forward, and record buttons on cassette tape recorders are therefore familiar to most people. Video cassette recorder manufacturers produced easy-to-use video cassette recorders by taking advantage of this common knowledge. The video cassette recorders are easy to use since the video cassette recorders used the same buttons, i.e., the play, stop, rewind, fast-forward, and record buttons, that audio cassette recorders utilize for operation.

To make the hand-held display device 170 easy to use, the present invention displays an intuitive graphical user interface on the hand-held display device 170. This section defines the graphical user interface which is provided to users on the hand-held display device 170.

To design a graphical user interface that is easy to navigate, designers should organize the graphical user interface with a structure that most users already understand. Humans live in a three dimensional geographic world. To survive in our three dimensional geographic world people must learn how to navigate around the local geographic area, including such geographic spaces their house, their neighborhood, and their town. In order to do this, each person creates a mental map of geographic spaces of their relevant local world.

Figure 2A:
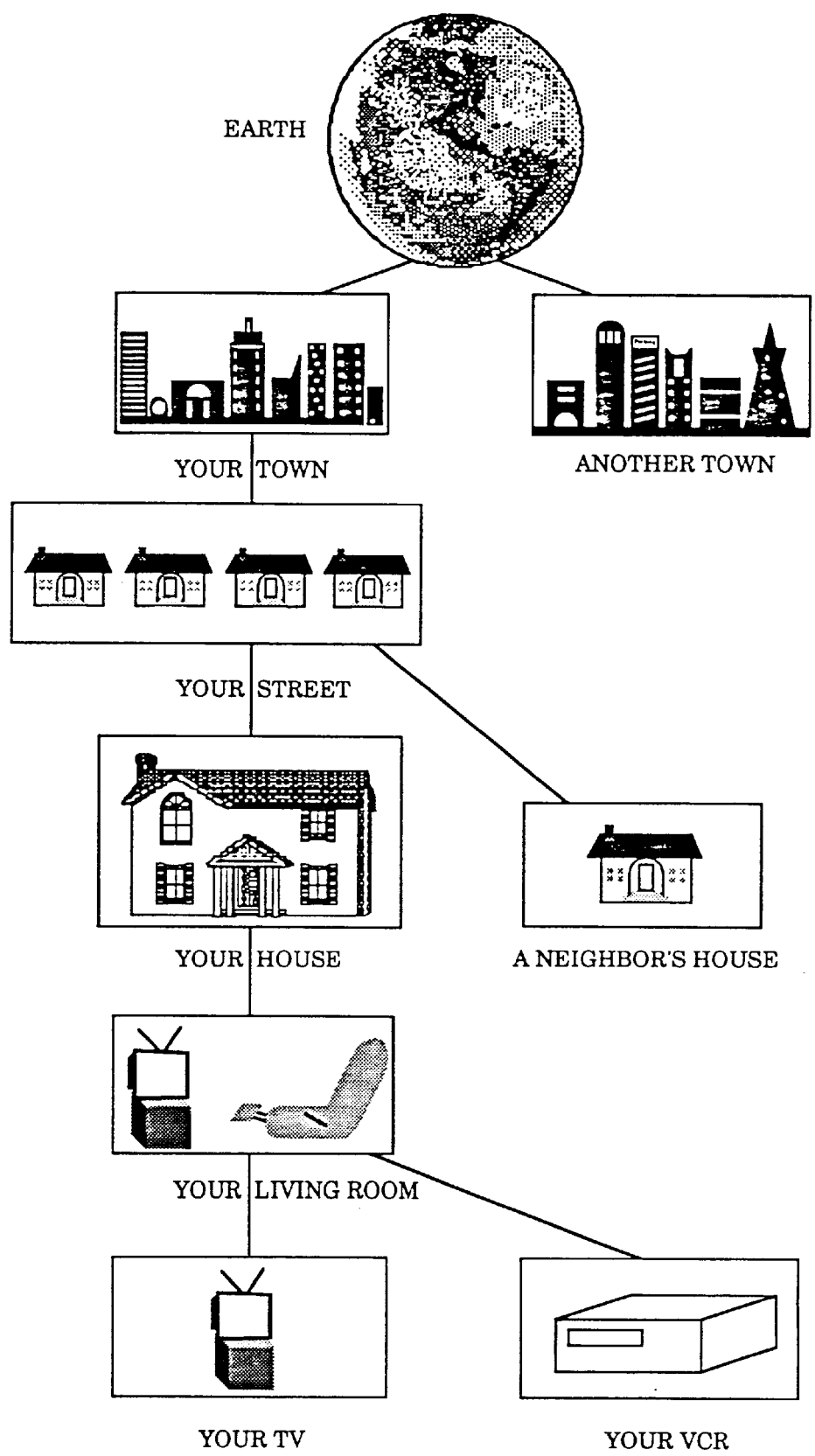
FIG. 2a illustrates a structure of different geographic spaces.

The mental maps of geographic spaces people create are de-facto geographic map structures. FIG. 2a illustrates a typical geographic map structure. For example, every person on this planet knows that they live on the Earth. Each person also lives in a certain town; yet, each person is aware that other towns exist on the Earth. Each person lives at a particular house on a particular street; yet, each person is aware that there are other streets in the town with other houses on each street. The identification of one particular house on one street within one town on Earth is a naturally occurring geographic map structure as illustrated in FIG. 2a.

The geographic map structure can be extended into the house. For example, the living room is one room of many within the house. The television, television program schedule and the video cassette recorder are objects within the living room. Each object can have its own geographic space. The map structure can also be extended to abstract spaces as well as geographic spaces. Each television program listed in a television program schedule has a program description. The program description can be considered a space within the television program schedule. Most people understand both the structure of geographic spaces and the detail that will be found within each geographic space. Therefore the de-facto geographic map structure of spaces represents a structure that is familiar to most people.

The present invention uses the familiar geographic map structure of our three dimensional world in a graphical user interface. The present invention describes a technique of user navigation in an arbitrarily large and complex geographic map structure through graphic background images that depict geographic spaces. Such geographic map structures improve a user's memory of complex data organization. The advantage of including such geographic map structures is that the familiar structures enable a wider range of people to use information storage facilitated by a computer.

Figure 2B:
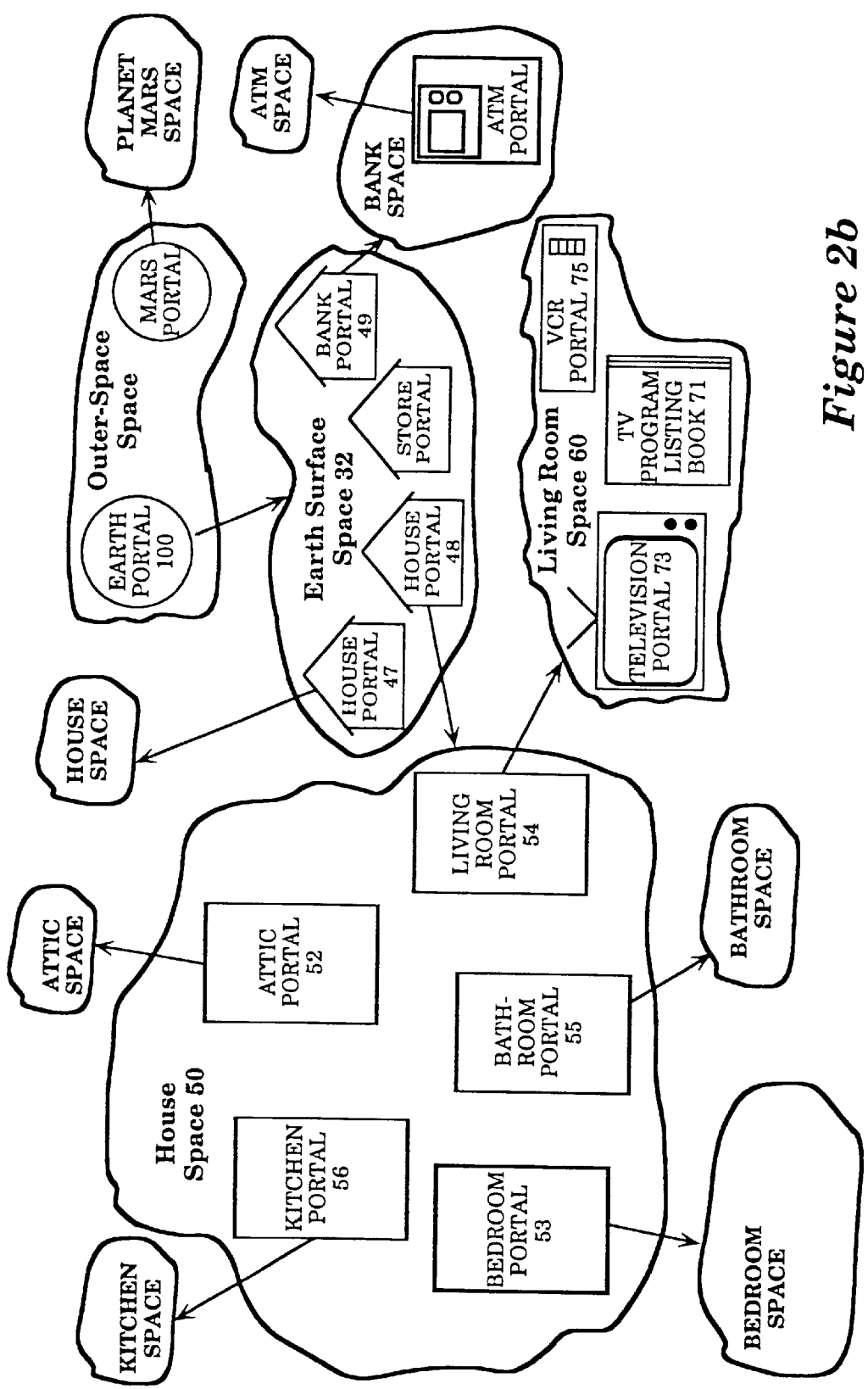
FIGS. 2b–2c illustrate a sample geographic map structure of spaces used to provide a user interface.
Figure 2C:
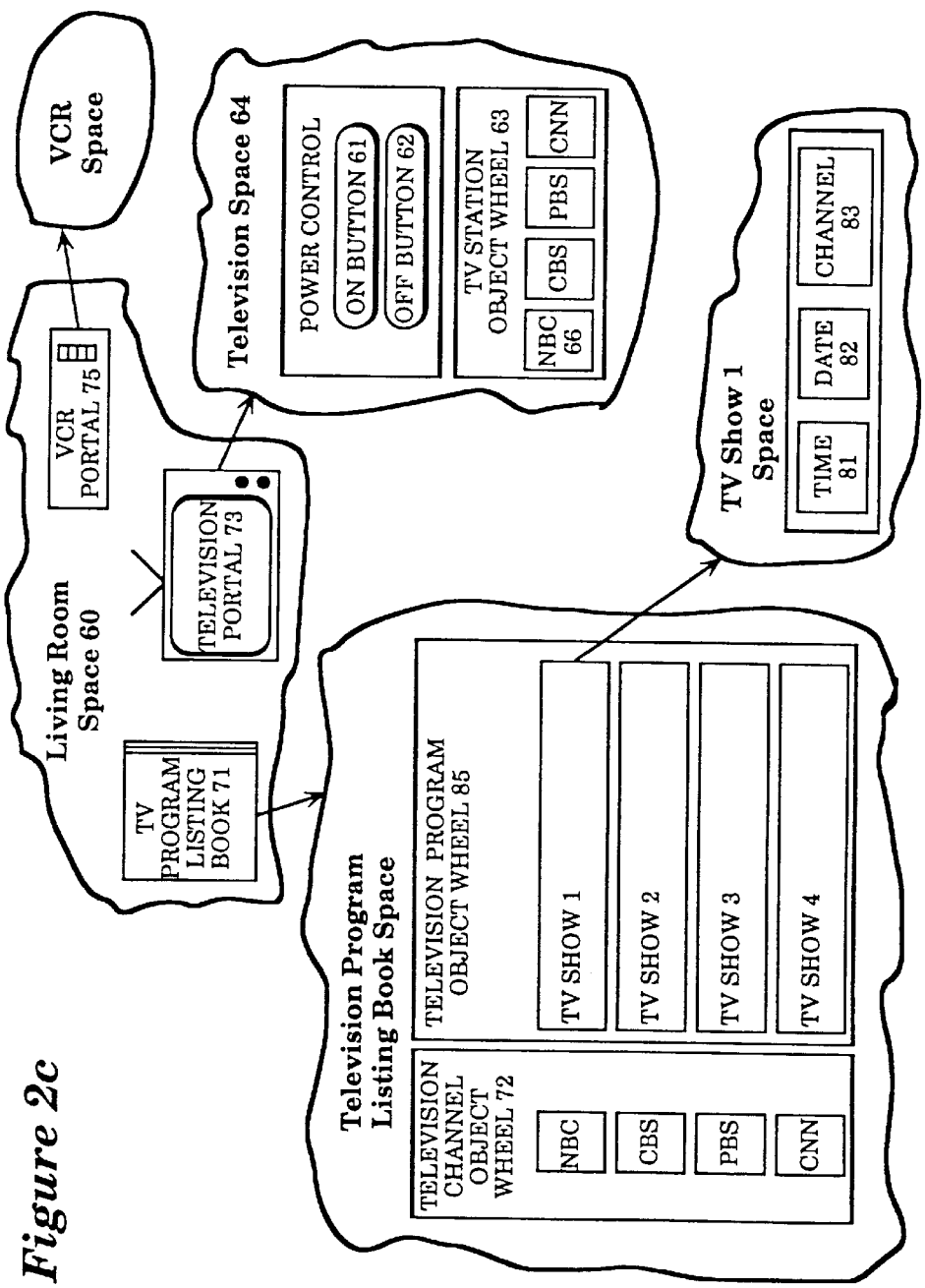

FIGS. 2b and 2c illustrate a sample geographic map structure utilized by the present invention. In the present invention, each Space in the geographic map structures of FIGS. 2b and 2c is represented as a background image on the display screen of hand-held display device such as the one illustrated in FIG. 1b. Located within each geographic Space are objects that can be selected and manipulated by the user.

User Interface Display Elements

The user interface environment of the present invention consists of two main display elements: "Spaces" and selectable "objects." Each area of the geographic map structure of FIGS. 2b and 2c represents a Space. The Space provides a geographic reference that informs a user of the user's current location within the geographic map structure. Within each Space are one or more "objects." A user may select and manipulate the objects within each Space. In the present embodiment of the hand-held display device 170 with touch screen display 37, a user may select objects by touching the objects displayed on the touch screen display 37. Pointing devices other than the user's finger and input devices, other than a touch screen, might handle selection and user input in a different manner.

Spaces

Each Space in FIGS. 2b and 2c has an associated background image that contains appropriate imagery for the Space. When a user enters a Space, the Space's background image is rendered on the display screen 37. Each background image contains landmarks that help the user identify where the user is. For example, the Earth's surface Space 32 of FIG. 2b is illustrated as the background images in FIG. 4 and FIG. 5. The Earth's surface background image of FIGS. 4 and 5 resembles a street on the Earth's surface, thereby informing a user that the user is at the Earth's surface Space of the map structure. The system renders the background image using desaturated or dimmed colors such that the background image can easily be distinguished from Selectable objects. The background image for a Space may be larger than the display screen 37; therefore, the present invention provides a gesture for "panning" such that a user may move around within a Space as will be explained later.

Objects

Objects are individual graphical icons that are rendered within the background images of Spaces. Each object is actually an object-oriented programming type of object containing data methods which can be invoked to act on the data. A user can select and manipulate any of the objects which appear within the background image of a Space. Each object is brightly colored and outlined in black. The bright colors distinguish the objects in a Space from the Space's background image that is drawn using desaturated colors. When a user points to an object, the user interface generates a "Selectable Object" sound that informs the user that the object can be selected and manipulated. Referring again to FIG. 4, in the present example, the houses 47 and 48 are objects that can be selected and manipulated by a user.

An "anticipation animation" is used in the present invention to inform the user when some action is taking place. The anticipation animation is a short animation displayed on the display screen 37 that is generated by the CPU 30. In most cases, the anticipation animation consists of enlarging an object's icon such that the icon appears to move closer to the user when the object is selected.

Figure 3:
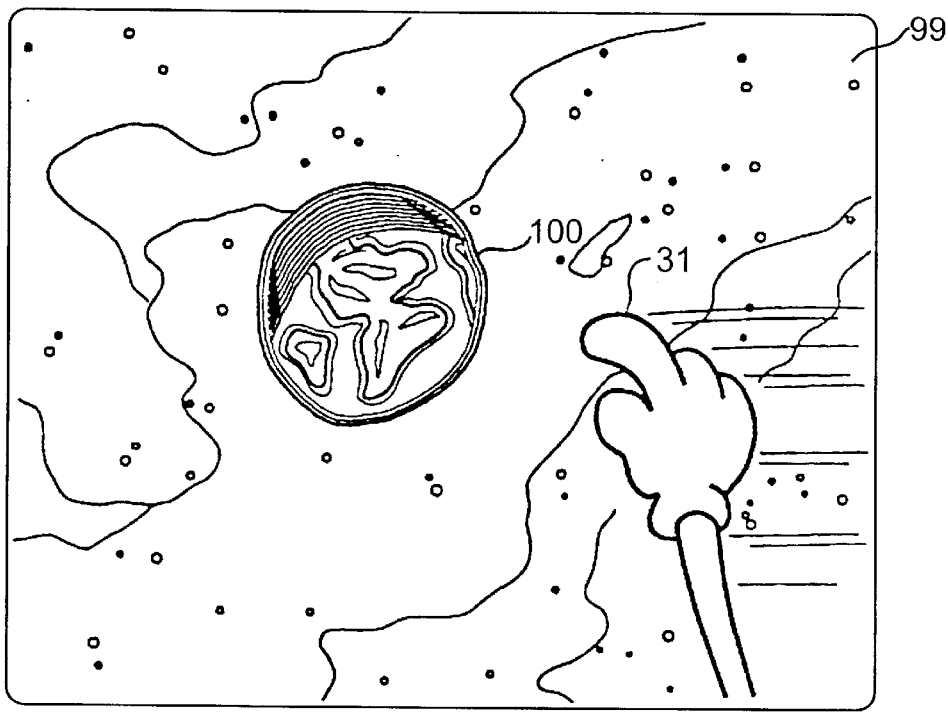
FIG. 3 illustrates a view of the outer-space Space of the user interface based upon the geographic map structure in FIGS. 2b and 2c.
Figure 4:
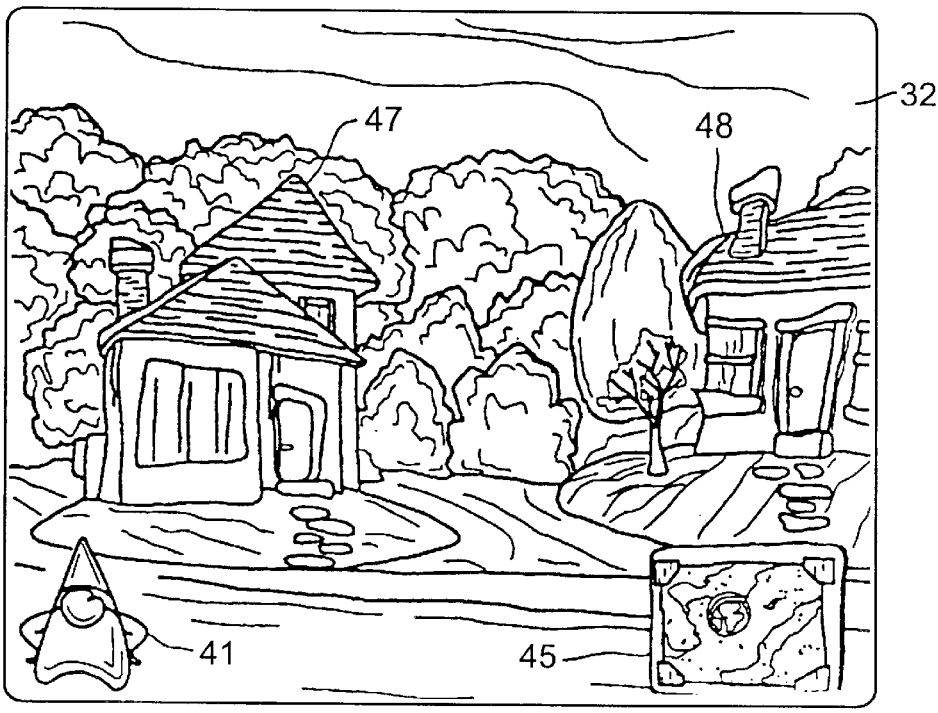
FIG. 4 illustrates a first view of the Earth's surface Space in the user interface based upon the geographic map structure in FIGS. 2b and 2c.

For example, referring to FIG. 3, when the Earth portal 100 is selected, the Earth portal 100 expands such that it appears to move closer to the user. After the Earth portal 100 anticipates, the user interfaces move the user to the Earth's surface Space 32 that is associated with the Earth portal 100 as illustrated in FIG. 4.

When a user selects an object by pointing to the object for a predetermined minimum period of time, a sound is generated, the object anticipates, and the CPU invokes a method within the object which performs an action associated with the object.

There are at least three types of objects that exist in the user interface of the present embodiment: data objects, buttons, and portals. The simplest object is a data object. Data objects are objects associated with a set of data. Buttons are objects that provide a means for accomplishing functions. Portals provide a method for moving between different Spaces. Each type of object will be explained individually below.

Data Objects

A data object is a simple object used to represent some piece of information. For example, a data object may represent a color or a television channel. The data objects have no methods that can be invoked to perform an associated action or function when the data object is selected. However, a data object can be dropped onto other objects that use the information in the data object. For example, a television program listing data object can be dropped onto a video cassette recorder object to program the video cassette recorder to record the television program.

Buttons

A button object is a special object that has an associated action or function. When a user selects a button, the CPU 30 invokes the action method in the button object to cause the execution of the action or function associated the button. When the button is selected, the CPU also anticipates the button and generates a "button action" sound providing feedback to the user that the button has been selected. Certain buttons provide additional visual feedback to inform the user of the results of the method invoked by the CPU to perform the action associated with the button.

For example, referring to FIG. 8, a television power "on" button 61 and a television power "off" button 62 are displayed. When a user selects the television power "on" button 61, the television power "on" button 61 anticipates and the CPU 30 generates the "button action" sound. The CPU 30 also invokes a method in the button object that transmits the necessary information to turn on a real television set associated with the television control panel illustrated in FIG. 8.

If the real television set is an "intelligent remote device", the television set may return a result value to the display device informing the user whether or not the television was turned on. The user interface may then light up the television power "on" button 61 and generate a "hum" sound to inform the user that the real television was actually turned on.

Buttons can be copied and moved to different Spaces so that a user can customize the "world" of the user interface. For example, the television power "on" 61 and the television power "off" 62 buttons could be copied, and the button copies moved from the television control Space to any other Space. A user may use the copies of the television power "on" 61 and the television power "off" 62 buttons in the new Space to control the television.

Portals

Portals are objects that provide a simple method of moving from the current Space to another Space associated with the portal. A user moves from the current Space to another Space associated with a portal by simply Selecting the portal. After a user selects a portal, the portal anticipates, generates a "movement through portal sound," and the CPU invokes a method that moves the user to the Space associated with the portal.

Figure 6:
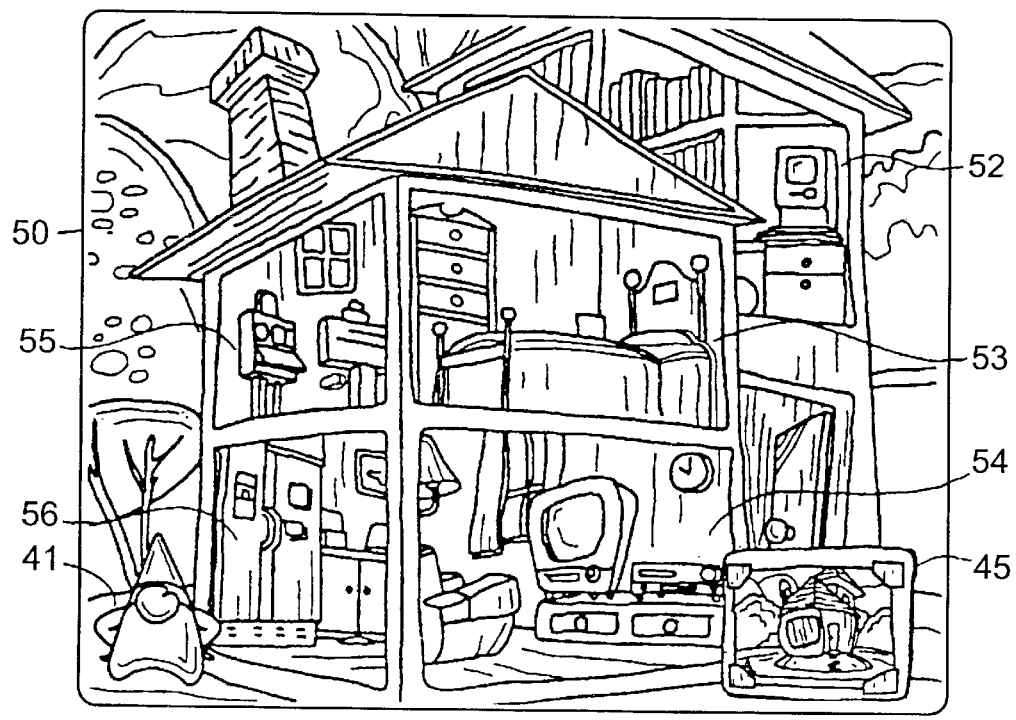
FIG. 6 illustrates a view of the first house Space of the user interface based upon the geographic map structure in FIGS. 2b and 2c.

For example, referring to the geographic map of FIG. 2b, to move from the Earth's surface Space 32 to the house Space 50, a user simply selects the house portal 48. Referring to the Earth's surface Space 32 as illustrated in FIG. 4, a user performs the move by selecting the house portal 48 within the Earth's surface Space 32. After being selected, the house portal 48 anticipates, generates a "movement through portal sound," and then the user is moved to the house Space 50 as illustrated in FIG. 6.

Portals can be duplicated and moved such that a user can customize the "world" of the user interface. For example, in FIG. 7 a television program schedule portal 71 is illustrated within the living room Space 60. The TV program schedule portal 71 is associated with a Space that contains TV program schedule information. A user can make a copy of the television program schedule portal 71 and move the copy to another Space where the user would like to be able to access the television program schedule. The user can then use the copy of the television program schedule portal to access the same information that could be accessed using the original television program schedule portal. Thus, a user would be able to access the same information from different Spaces.

There are two special portals that are almost always available to an operator of the user interface: a Wayback portal and an Agent portal.

The Wayback Portal

The Wayback portal provides a way for a user to trace back a path that the user has traveled along between different Spaces. The Wayback portal 45 consists of a small rectangular frame that encloses a snapshot of the previous Space along the path of Spaces that the user traveled along. Since the background image for a Space can be larger than what can be seen in a single view, the Wayback portal shows a snapshot of the view of the previous Space exactly as it appeared when the user went through a portal in that previous Space. In the present embodiment, the Wayback portal is available to the user in every Space in the lower right-hand corner of the display screen. If desired, the user can move the Wayback portal to a new location on the display screen such that the Wayback portal will then appear at the new location on the screen in every Space.

To move one step backward along the current path, the user Selects the Wayback portal 45. When Selected, the CPU 30 anticipates the Wayback portal 45, generates a "move through Wayback portal" sound, and moves the user to the Space pictured within the Wayback portal. In the present embodiment, the "move through Wayback portal" sound is actually the same sound as the "move through portal" sound except that it is played backwards. By playing the "move through portal" sound backward when moving through the Wayback portal, the movement backward along the current path is emphasized to the user.

As users go through portals they leave a trail of invisible markers. Each marker represents a visit to a Space. The Wayback manages these markers and maintains them in the order that the Spaces are visited. The markers and the markers' order define the path that the user has taken through the world of the user interface. Thus, when a user goes though the Wayback, the path defined by the markers is retraced one marker at a time. Each time the user goes through the Wayback to a Space, a marker is removed from those currently managed by the Wayback.

For example, referring to geographic map structure illustrated in FIG. 2b, if a user starts in the outer-space Space 99, moves to the Earth's surface Space 32, and then moves to the house Space 50; a path will be generated from the outer-space Space 99 to the Earth's surface Space 32 to the house Space 50. After traversing this path, the display screen 37 will display the house Space 50 as depicted in FIG. 6. In the lower right corner of the house Space 50 is the Wayback portal 45. As illustrated in FIG. 6, the Wayback portal 45 displays a miniature snapshot of the previous Space along the Space path. In this case, the previous Space along the Space path is the Earth's surface Space 32; therefore, the Wayback portal 45 displays a miniature snapshot of the Earth's surface Space 32 as it appeared when the user went through the house portal. If the user then Selects the Wayback portal 45, the Wayback portal 45 anticipates, generates the "move through Wayback portal" sound, and then moves the user to the Earth's surface Space 32 as depicted in FIG. 4. At the Earth's surface Space 32 as depicted in FIG. 4 the Wayback now displays a miniature snapshot of the outer-space Space 99, which was the first Space along the path. The Wayback portal 45 therefore provides a "way back" along the path of Spaces the user has traveled.

The present invention implements the Wayback portal 45 as a stack of data structures, wherein each data structure contains a pointer and a pair of coordinates. The pointer in each data structure on the stack points to a Space that the user has previously visited. The pair of coordinates in each data structure on the stack specifies exactly where the user was within the Space pointed to by the pointer when the user left the Space through a portal. Each time the user moves through a portal from a particular Space, the user interface "pushes" a data structure, containing the pointer to the Space and the coordinate pair which defines exactly where the user was within the Space when he went through the portal, onto the wayback stack. The Wayback portal 45 displays a miniature snapshot of the Space that is pointed to by the pointer in the data structure on the top of the stack. To trace back along the path of Spaces, each time the user Selects the Wayback portal 45, the user interface "pops" a data structure off the stack and moves to the Space indicated by the pointer in the data structure.

The Agent Portal

The Agent is an anthropomorphic character that aids the user in navigating around the user interface and in dealing with events that occur in the "world" created by the user interface. Referring to the Earth's surface Space of FIG. 4, the Agent 41 is illustrated in the lower left corner. The Agent 41 carries objects around for the user. This carrying function is represented by a briefcase, which the Agent also carries. A user can access objects that the Agent is carrying by Selecting the Agent portal 41 thereby entering an Agent Space associated with the Agent portal 41. When a user Selects the Agent portal 41, the Agent anticipates by appearing to pull out the briefcase and open the briefcase up. The CPU then generates the "move through portal" sound and moves the user to the Agent Space.

To place an object into the Agent's briefcase, a user picks up the object and then "Drops" the object onto the Agent portal 41. The object Dropped onto the Agent portal 41 is then always accessible to the user from any Space by entering the Agent's Space. The Agent is discussed more fully below in the section entitled "The Agent."

Object Wheel

It is often necessary that a user make choices among an large, arbitrary number of objects. Therefore, the user interface must provide both a method of displaying a large number of objects and a method of allowing the user to Select any of the displayed objects.

For example, referring to the television control Space 64 illustrated in FIG. 8, the user interface of the present invention must provide a method of displaying an arbitrary number of television channels for the user to choose from. In any system, screen space is at a premium, so when the user must choose among many possible options, the options must be presented compactly. In the present invention, if there are 500 television channel objects for a user to select from, presenting them all at once would not only take up significant screen space, but the visual context of the list (i.e., why is the user looking at this list in the first place)

would be lost. Thus, a method for allowing the user to browse through the available objects is required.

The user interface of the present invention introduces an "object wheel" to provide a method for allowing a user to choose from a large group of objects. In the object wheel, a few immediately accessible objects are displayed in an object wheel on the display screen while the remaining objects in the group are not rendered on the screen. To access the objects not rendered on the screen, the user "Spins" the object wheel to move the previously inaccessible objects into view on the display screen.

Figure 12:
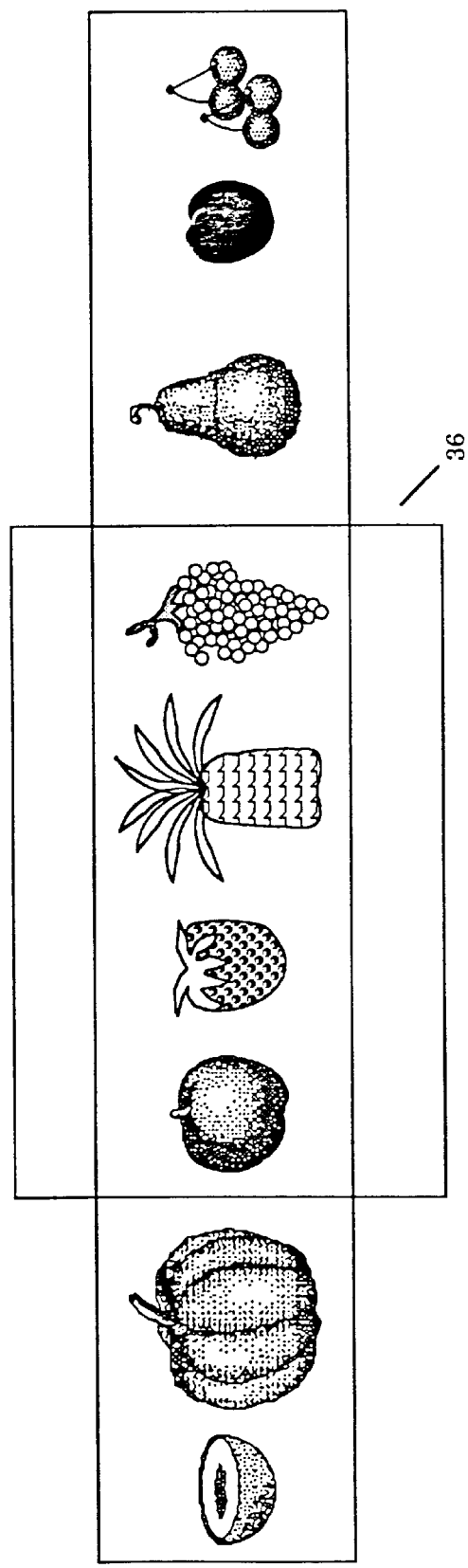
FIG. 12 illustrates a view of a plurality of objects which do not fit on a single screen display.
Figure 13:
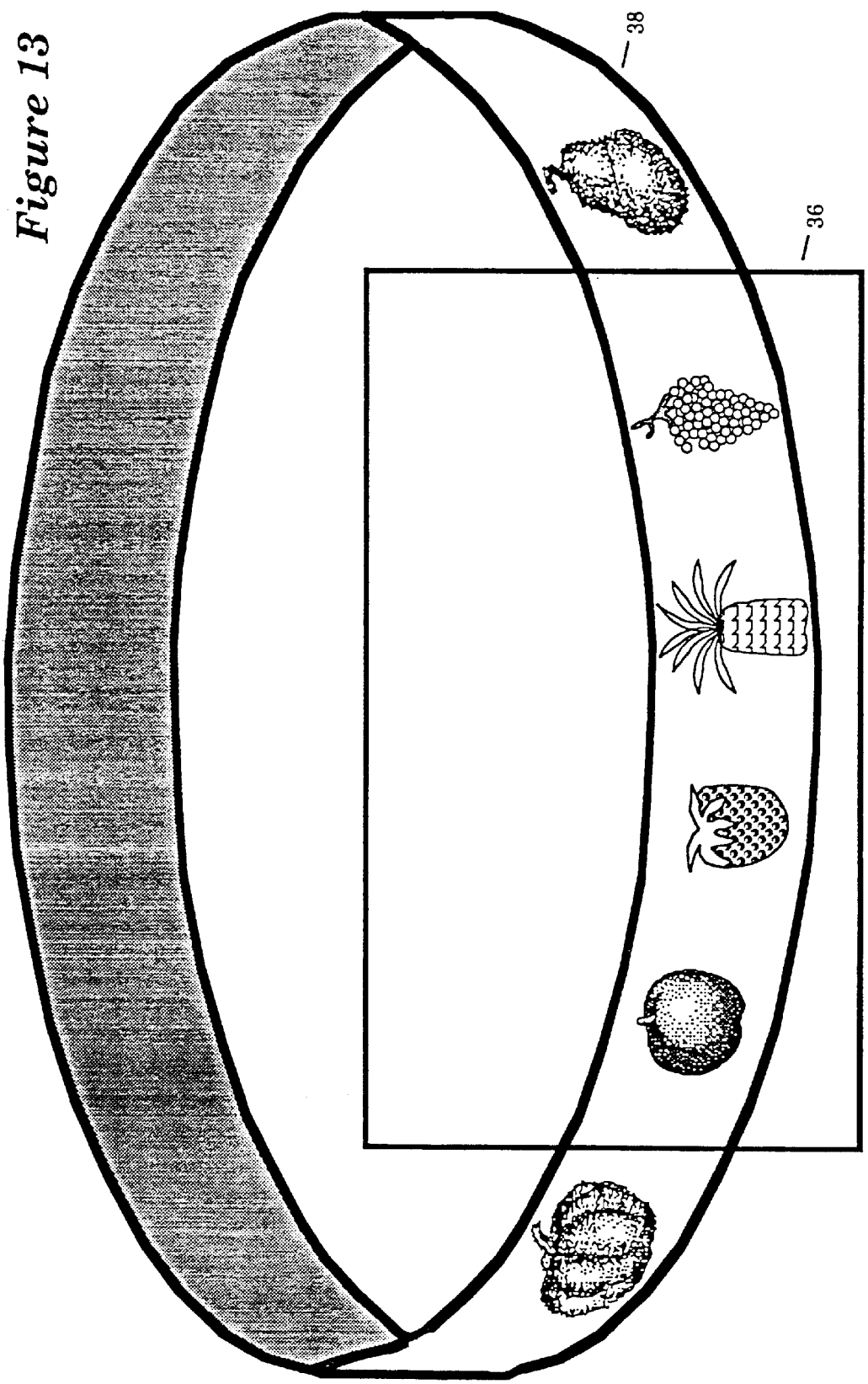
FIG. 13 illustrates a conceptual view of the plurality of objects placed on an object wheel.
Figure 14:
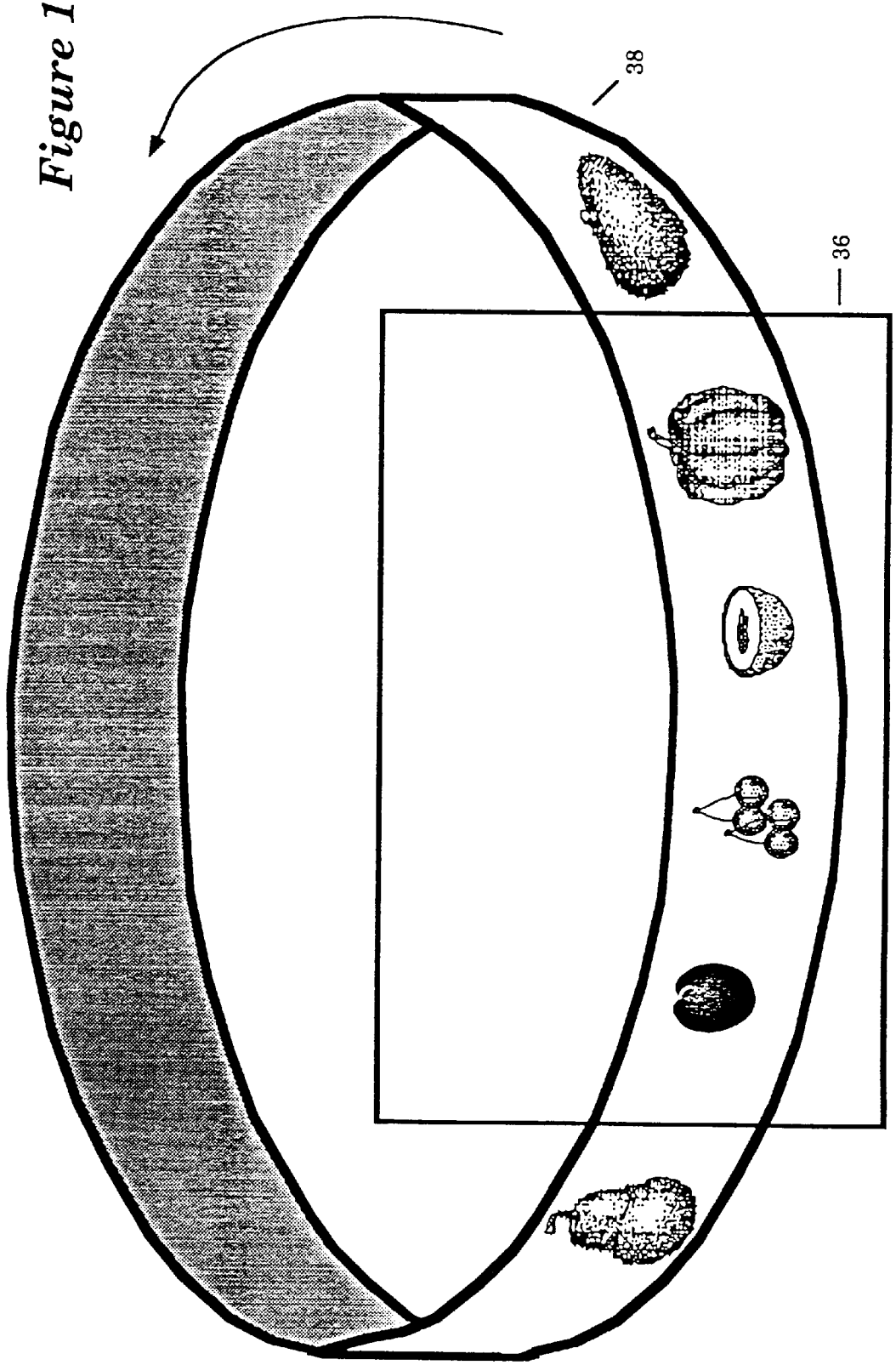
FIG. 14 illustrates a conceptual view of the object wheel of FIG. 13 where the object wheel has rotated revealing new objects.

Referring to FIG. 12, a large number of fruit objects are available for a user to choose from, yet only four fruit objects fit horizontally on the display screen 37 at once. To provide the user with access to all the fruit objects available, the present invention puts the strip of fruit objects onto an "object wheel" 38 as displayed in the conceptual diagram of FIG. 13. A few of the objects on the object wheel 38 are immediately accessible to a user on the display screen 37. To access the objects that are not displayed on the display screen 37, the user rotates the object wheel 38. As the object wheel 38 rotates, new objects are brought into view and other objects disappear from view as illustrated in FIG. 14. An operator uses the navigational gestures Point, Spin, and Pickup to manipulate the object wheel presented on the touch screen display 37. These three navigational gestures are explained in the following section.

In order to enhance the user's feeling that a real wheel is being spun, object wheels obey the laws of physics. For example, the object wheels have mass and therefore inertia; object wheels spin faster as the user applies more "force" when spinning the wheel; object wheels respond to friction since a spinning object wheel gradually stops spinning.

While an object wheel is spinning and the objects are moving across the screen, the current embodiment of the user interface generates a "clicking" sound. The "clicking" sound generated by the user interface simulates the sound made by detents on a slot machine wheel which forces the wheel to stop and be aligned. Like a real wheel, the object wheels of the present invention always stop aligned, and never stop in between object choices. A user can stop a spinning object wheel at any time by Pointing to a moving object on the object wheel while the object wheel is spinning.

An object wheel can be aligned vertically or horizontally on the display screen. When placed vertically, the object wheel can be spun both up and down. When placed horizontally, the object wheel can be spun both left and right.

User Interface Navigational Gestures

Navigation and object manipulation in the user interface are performed using a screen pointing device. In the preferred embodiment, the hand-held display device 170 is constructed with a touch screen display 37 and the pointing device used is a user's finger. Alternatively, the user interface may be implemented using any other type of screen pointing device such as a mouse, a trackball, or a joystick. This specification, however, will only describe the preferred embodiment that uses the user's finger as a pointing device on a touch screen.

In the preferred embodiment of the present invention, the hand-held display device 170 comprises, in part, a touch screen display 37 as illustrated in FIG. 1b. The touch screen display 37 senses when a finger has been placed on the display screen and identifies where the finger has been placed. Users select objects on the touch screen and manipulate the objects using a set of six navigational gestures: Point, Select, Pan, Spin, Pickup, and Drop. Each navigational gesture used by the user interface is explained individually below. (Since the navigational gesture names are the same as common words, this specification will capitalize all references to the navigational gestures.)

Point

Point is the most simple gesture in the user interface of the present invention. An operator uses the Point gesture to pick objects rendered on the display screen. For example, if the user interface of the present invention requests the user to choose one of many objects rendered on the display screen, the user Points to an object to choose the object.

A user Points to an object by simply placing a finger on the object displayed on the touch screen. When a user has successfully Pointed to an object, the user interface generates a "Selectable Object" sound. The Selectable object sound provides feedback to the user indicating that the user has successfully Pointed to the object.

Select

The Select gesture is very similar to the Point gesture. An operator uses the Select gesture to have an object invoke a method to perform an function or action associated with the object. For example, a Selected portal invokes a method that moves the user to the Space associated with the portal and a Selected button invokes a method that performs the action or function associated with the button.

To Select an object, a user first Points to an object by touching the object with a finger. If the user continues to Point to the object for a predetermined minimum period of time, the object becomes Selected. After a user Selects an object, the object "anticipates," generates a sound for user feedback, and then a method within the object is invoked. If the object is a button, then the method invoked performs a function associated with the button. If the object is a portal, then the method invoked will move the user to the Space associated with that portal.

Alternatively, a user can Select an object on the display screen by quickly Pointing to the object twice in succession. When a user Selects an object by quickly Pointing to the object twice, the object does not anticipate. Instead, the user interface only generates the appropriate feedback sound and then performs the action associated with the object. This provides the user a method of Selecting an object quickly.

Pan

To move around within a Space a user uses the Pan navigational gesture. A user Pans though a Space by placing a finger on the background image of a Space displayed on the touch display screen 37 and sliding the finger in the desired direction of movement. The user interface of the present invention responds by generating a "Tan Active" sound and moving background image of the Space and all the objects within the Space in the opposite direction of the finger's movement. By moving the Space in the opposite direction, the user interface simulates movement of the users' point of view in the other direction.

Figure 5:
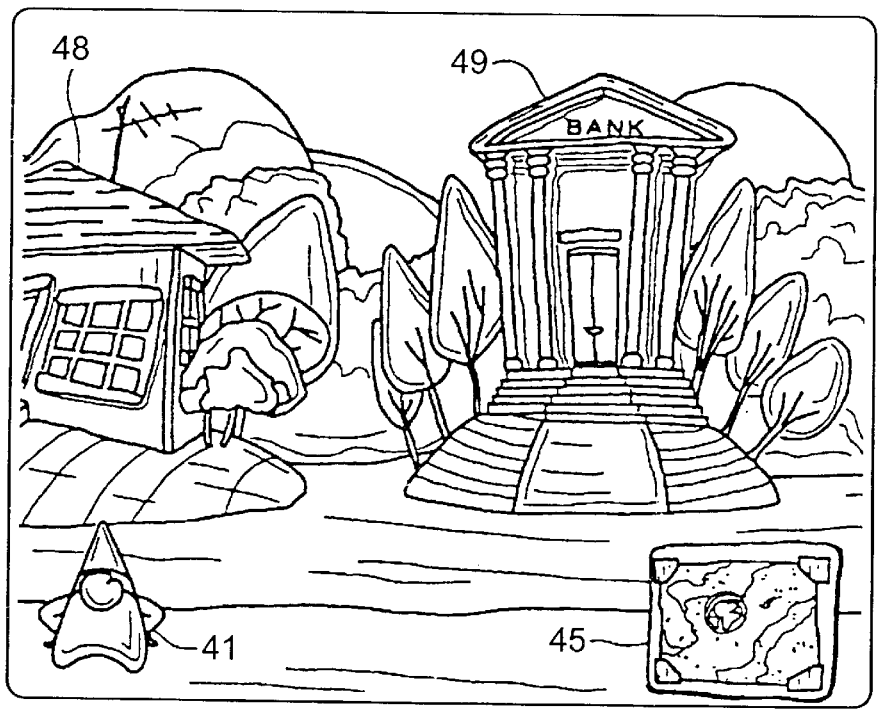
FIG. 5 illustrates a second view of the Earth's surface Space in the user interface based upon the geographic map structure in FIGS. 2b and 2c.

FIGS. 4 and 5 illustrate the use of the Pan gesture. If a user places his finger on the background of FIG. 4 and then slides the finger on the touch screen to the right, the view will correspondingly pan to the right by moving the background image of the Space and all the objects within the Space to the left. FIG. 5 illustrates the result of the Pan right operation where house 48 has moved from the right side of the display screen over to the left side of the display screen.

The background image for each Space in the present invention can be arbitrarily large. If the background image of a Space has finite size, the user interface of the present invention provides feedback that the furthest extent of the background image has been reached. When a user Pans in a direction all the way to the end of a background image, the Pan gesture will not move the user any further in that direction. To inform the user of this fact, the user interface generates an "end of extent" sound instead of the "Pan Active" sound when a user attempts to Pan past the end of a background image. The "end of extent" sound sounds like a "thud" made when something bumps into a wall. The "end of extent" sound thereby informs the user that the user has hit the end of the background image and can go no further.

Spin

An operator uses the Spin gesture to browse through several objects placed on an object wheel. When a user Spins an object wheel, the visible objects on the object wheel move across the display screen and disappear off one end of the screen and previously invisible objects move onto the display screen at the other end.

Figure 15:
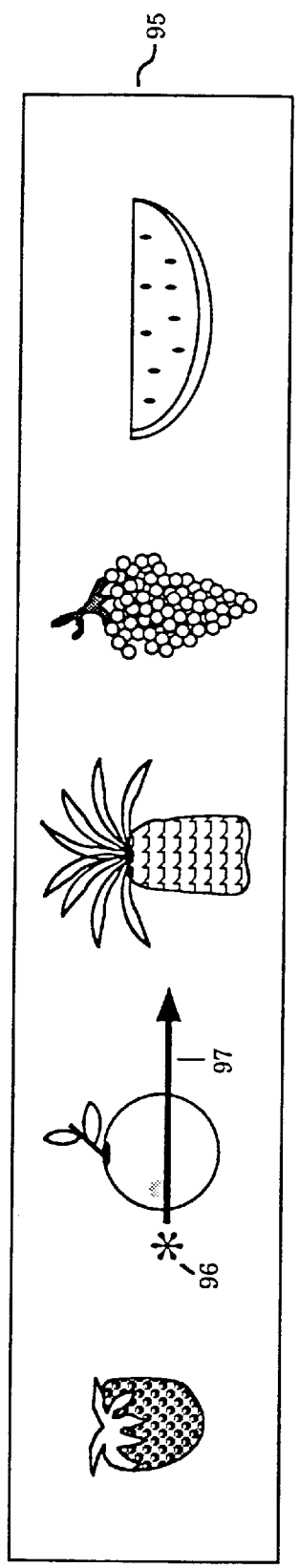
FIG. 15 illustrates the Spin gesture being used to spin an object wheel.

A user Spins an object wheel by placing a finger on the object wheel and then moving the finger across the display screen in a direction parallel to the object wheel's movement. FIG. 15 illustrates the Spin gesture. In FIG. 15, a user first places a finger on the object wheel (as shown by the asterisk 96). The user then slides the finger across the object wheel (as shown by the arrow 97). This finger gesture causes the object wheel to Spin in the direction of the finger's movement. The faster the user slides the finger across the object wheel on the display, the faster the object wheel spins. Once the object wheel is spinning, the objects on the object wheel appear at one end of an object wheel, move across the display screen, and then disappear off the other end of the object wheel similar to figures which appear on a slot machine wheel.

Pickup

The Pickup gesture is used to pickup an object located within a Space or on an object wheel such that a user can carry the object around the "world" defined by the user interface of the present invention. In the present embodiment, different methods are used to Pickup an object from a Space or an object wheel. Each method will be explained individually below. However, it will be appreciated that the same gesture could be used to pickup objects in both situations.

Figure 16A:
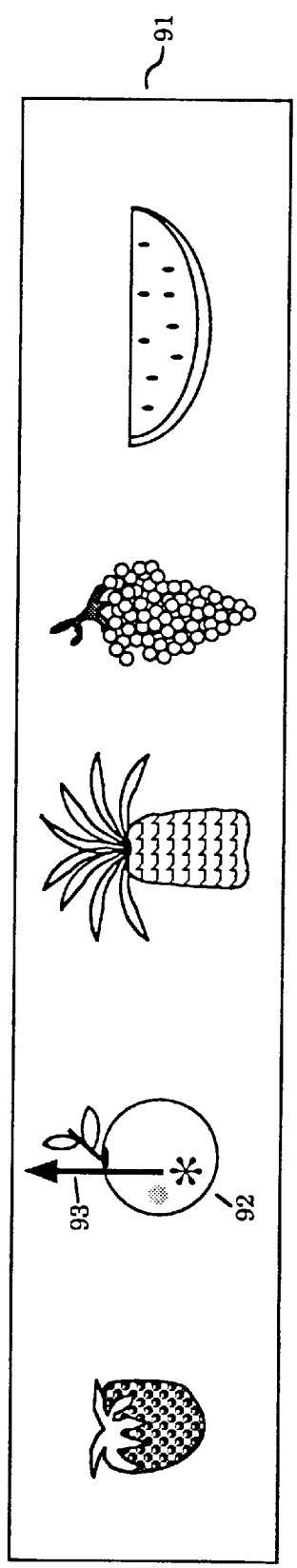
FIG. 16a illustrates a Pickup gesture being used to pickup an object off an object wheel.

The gesture used to Pickup an object from an object wheel is illustrated in FIG. 16a. FIG. 16a illustrates an object wheel 91 with a number of fruit objects to choose from. To Pickup one of the fruit objects disposed on the object wheel 91, a user first places a finger on the object (as designated by the asterisk 92) and moves the finger in a direction perpendicular to the motion of the object wheel. The movement of the finger in a direction perpendicular to the motion of the object wheel is illustrated by arrow 93. The perpendicular finger motion "tears" the object off the object wheel such that the user can move the object. When the object comes loose from the object wheel, the user interface generates a "tearing" sound that informs the user that the object has been removed from the object wheel. When an object has been picked up, the object casts a shadow onto the background image of the Space and moves the object along with the user's finger.

Figure 16B:
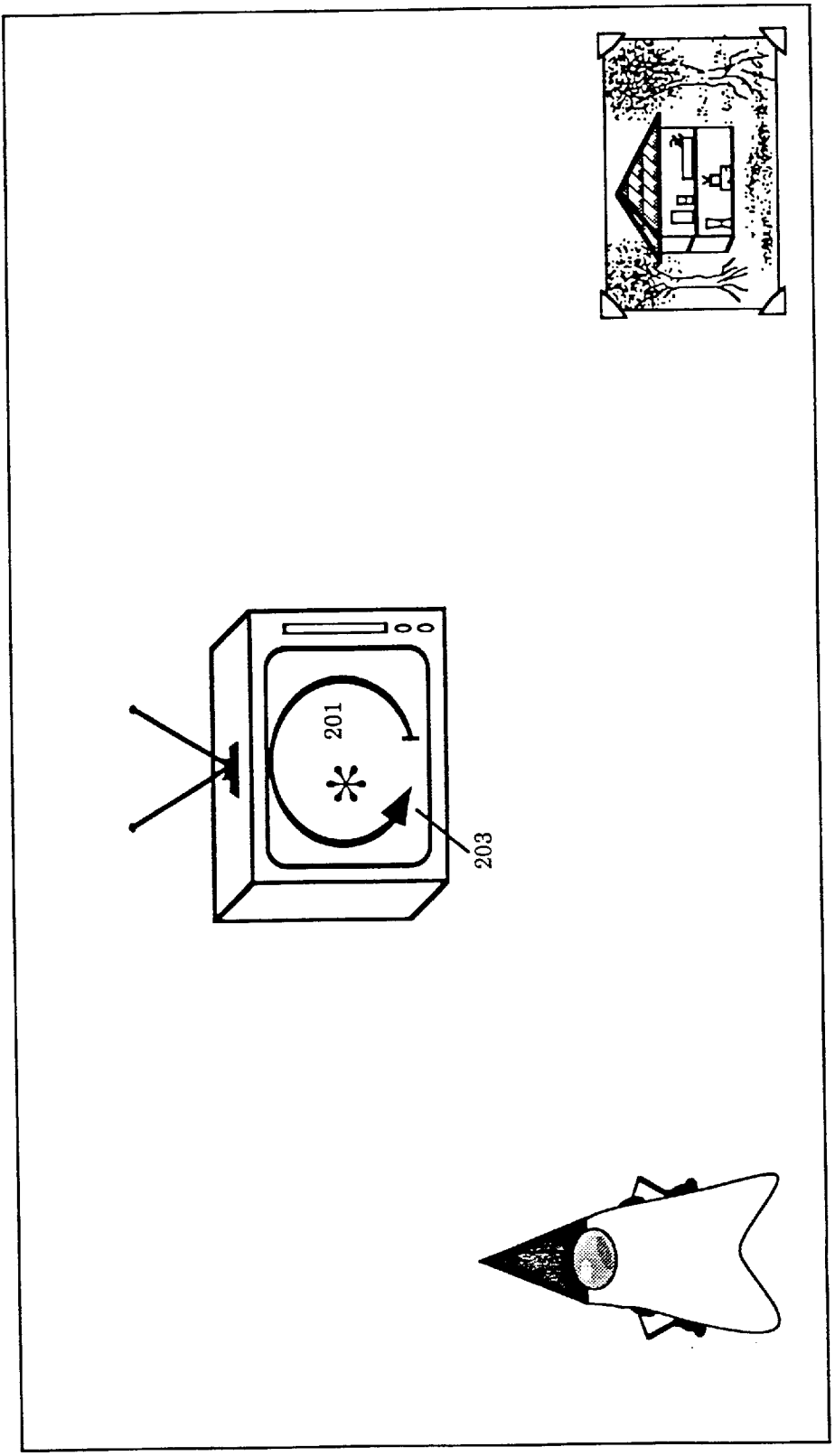
FIG. 16b illustrates a Pickup gesture being used to pickup an object from a Space.

The gesture used to Pickup an object from a Space is illustrated in FIG. 16b. FIG. 16b illustrates a Space with an object in the center. To Pickup the object, a user circles the object with the finger as illustrated by arrow 203 and then touches the object as illustrated by asterisk 201. When the object comes loose from the Space, the user interface generates the tearing sound that informs the user that the object has been picked up. After an object has been picked up from a Space by a user, a ghost image of the object remains at the object's original location The ghost image of the object is drawn in desaturated colors indicating to the user that the ghost object cannot be Selected.

After a user has picked up an object, either from an object wheel or a Space, the user interface generates a "carrying object" sound that informs the user that an object is being carried. The user can move the carried object within a Space, from Space to Space, or Drop the carried object onto another object.

Drop

The final gesture used to interact with the user interface of the present invention is Drop. After a user has used the Pickup gesture to pick up an object from a Space or from an object wheel, the user must continue to keep the finger pressed against the screen to carry the object. The user moves the carried object by sliding the finger across the touch screen display system. After moving the carried object to a desired location, the user then uses the Drop gesture to place the object at the desired location. To drop the object the user lifts the finger off the touch screen display. When the user Drops an object, the object falls into the background image of a Space as if pulled by gravity, and the object no longer casts a shadow.

A user of the present invention uses the Drop gesture to perform a number of different functions. The Drop gesture can be used to copy an object by picking up the object and Dropping the object into a portal such that a copy of the object is created in the Space associated with the portal. The Drop gesture can be used to move an object to a new location by picking up the object and Dropping the object at the desired location. The Drop gesture can also be used to provide a data object containing information to another object which uses the information to perform a function. Each different use of the Drop gesture will be explained below.

To make a copy of an object using the Drop gesture, a user must first Pickup the object and then Drop the object onto a portal. An object that has been picked up is carried over the portal by sliding the finger across the screen. Once the carried object is over the portal, the portal becomes highlighted such that it provides feedback to the user signaling that the carried object is over the portal. In the present embodiment, the portal emits a green glow. To Drop the carried object into the portal, the user lifts the finger away from the touch screen display. The object is then displayed such that it passes through the portal with an appropriate animation. During the animation, the CPU 30 generates a "sucked through portal" sound effect. When the object has completely disappeared through the portal, the ghost image of the object drawn in desaturated colors in the present Space changes back into a brightly colored object. This provides visual feedback to the user that the original object remains in the present Space even though a copy of the object has been sent through the portal to another Space.

Users can move objects either within a single Space or from one Space to another. To move an object within a single Space a user first uses the Pickup gesture to pick up an object, moves the object to the desired new location, and then Drops the object using the Drop gesture. After the object is Dropped, the ghost image of the object merges with the Dropped object at the new location to form a single brightly colored image of the object at the new location. This informs the user that the object has been moved to a new location and that a copy has not been made.

Moving an object to another Space is accomplished by carrying the object through a portal to another Space. To move an object to another Space, a user must first Pickup the object and then carry the object over a portal. Once the carried object is over the portal, the portal becomes highlighted such that it provides feedback to the user signaling that the carried object is over the portal, and the portal emits a green glow. To move the carried object through the portal, the user holds the object over the portal for a predetermined minimum amount of time. The portal eventually anticipates moving the user and the carried object to the Space associated with the portal. The ghost image of the carried object drawn in desaturated colors is also moved along, with the user, and the carried object to the destination Space. When the user Drops the carried object by lifting his finger off of the touch screen display system, the carried object and the ghost image merge into a single brightly colored image of the object. This provides feedback to the user that the object has been moved to the Space and has not been copied.

The Drop gesture can also be used to provide information to an object. A user provides information to an object by Dropping an object containing data (i.e. a data object) onto the object which will use that data.

To provide information to an object, a user must first Pickup a data object that contains the necessary information. The user then carries the data object over the object which can utilize the information. When the carried data object is over the object that can utilize the information, the object that can utilize the information becomes highlighted if the carried data objectis of the correct dass. By becoming highlighted, the object that can utilize theinformation provides feedback to the user that the carried data object is of thecorrect class. To Drop the data object into the object that can utilize the information, the user lifts his finger used to carry the data object away from the touch screen. The data object is then passed through and into the portal with appropriate animation and sound effects. When the data object has completely disappeared into the receiving object which can use the information, the receiving object then performs the appropriate function on the data provided.

For example, the Drop gesture can be used to provide television program information to the video cassette recorder object which is associated with a physical video cassette recorder, such that the video cassette recorder programs itself to record the television program. To program the video cassette recorder, a user first uses the Pickup gesture to pickup a data object containing television program information. The user then carries a television program data object over the video cassette recorder object. The video cassette recorder object then modifies its appearance to indicate it is a "program video cassette recorder" mode. This informs the user that the video cassette recorder "understands" the information that is over it (i.e., the video cassette recorder will be programmed to record the television program if the user Drops the television program data object onto the video cassette recorder).

When the user Drops the television program object into the video cassette recorder, the video cassette recorder object recognizes that the television program data object contains information it can use. The video cassette recorder then extracts the time and channel information from the television program data object such that the video cassette recorder object programs itself to record the television program.

A Tour of the Present Embodiment in Operation

To best convey the look and feel of the user interface of the present invention, a "tour" through a sample environment is provided with reference to FIGS. 3–10. The sample environment explored in the tour is based upon the geographic map structure of Spaces diagrammed in FIGS. 2b and 2c. The tour through the sample environment described herein is not intended to limit the scope of the present invention, but instead to provide an example of one possible embodiment of the present invention. Due to the limitations of a written Specification in describing the present invention's animated user interface, the reader is encouraged to view a video tape entitled "Green Project User Interface," submitted by the applicant concurrently with the filing of the application on which this patent is based.

Referring to FIG. 3, upon first entering the user interface of the present invention, the user interface initially positions the user in an outer-space Space 99. This Space is illustrated in the geographic map structure of Spaces diagrammed in FIG. 2b. Although, the user is initially placed in the outer-space Space 99, the user interface will later start the user at the last Space the user was in when the user quit using the hand-held display device. Referring again to FIG. 3, at the outer-space Space 99, the user interface renders a brightly colored Earth portal 100 against a dark outer-space background image on the display screen.

Soon after entering the user interface, an outline of a hand 31 appears on the display screen to teach the user how to navigate around the user interface. The hand 31 that appears on the display screen is the hand of the Agent. The Agent's hand 31 extends a finger to touch the screen and then slides the finger across the screen causing the Space and objects on the screen display to Pan and the user interface to emit the "Panning active" sound. Referring to FIG. 3, the outline hand 31 of the Agent is shown moving across the screen. By touching the display screen and moving a finger across the display screen, the Agent's hand 31 demonstrates to a new user how to use the Pan gesture to move around the view of a Space.

After demonstrating how to use the Pan gesture to move around in a Space, the hand 31 of the Agent next demonstrates how to use the Point and Select gestures. The Agent demonstrates how to use the Point gesture to Point to an object by placing a finger on the Earth portal 100. After the Agent Points to the Earth portal 100, the user interface emits the "Selectable Object" sound to provide feedback which informs the user that the Earth portal 100 is a Selectable Object. The Agent then demonstrates how to use the Select gesture to Select an object by continuing to Point to the Earth portal 100. After the Agent's hand 31 Points to the Earth portal 100 for the predetermined minimum amount of time, the Earth portal 100 anticipates and the CPU generates the "move through portal" sound. The Earth portal 100 anticipates by expanding rapidly such that the Earth portal 100 appears to move closer to the user. The screen then fades and a new background image appears displaying the Earth's surface Space 32 associated with the Earth portal 100, as illustrated in FIG. 4.

At the Earth's surface Space 32, the Agent portal 41 appears to "jump" onto the touch screen display 37 and moves to the lower left corner of the display screen. The Agent 41 will always be accessible to the user because the agent appears in every Space, except the Agent's Space. If desired, the user can move the Agent from the lower left corner to a different location on the display screen. This movement of the Agent will change the Agent's location in every Space.

Referring to FIG. 4, in the lower right corner of the display is the Wayback portal 45. The Wayback portal 45 displays a framed snapshot of the outer-space Space 99 from FIG. 3 which the user just came from. If the user Selects the Wayback portal 45, the user interface of the present invention moves the user back along the traveled path to the Space illustrated within the Wayback portal 45. For example, if the user desires to return to the outer-space Space 99 displayed in the Wayback portal 45, the user simply Selects the Wayback portal 45.

The Earth's surface Space 32 depicted in FIG. 4 is comprised of a number of houses and community buildings such as stores, banks, schools, etc. Each building in the Earth's surface Space 32 represents a portal that can be Selected by the user to move the user to a Space associated with the portal. For example, in the Earth's surface Space depicted in FIG. 4, the first house 47 and the second house 48 are portals which can be Selected by the user. If the user Selects either the first house 47 or the second house 48, the user will be moved to an associated house Space.

While within the Earth's surface Space depicted in FIG. 4, the user can move around in the Space by using the Pan gesture on the touch screen as demonstrated by the Agent's hand 31 in FIG. 3. To Pan, the user simply places a finger on the screen and moves the finger in the direction the user wishes to move. The user interface responds to the user's finger motion by generating the "Panning Active" sound and moving the background image and the objects on the screen in the opposite direction of the finger's movement, thereby bringing other objects into the view.

For example, if a user viewing the Earth's surface Space 32 as depicted in FIG. 4 wishes to move to the right, the user simply places a finger onto a background area of the Earth's surface Space 32 and slides the finger to the right. The user interface reciprocally responds to the user's finger motion by moving the Space's background image and the objects in the Space to the left. FIG. 5 depicts the view of the Earth's surface Space 32 after the user has placed a finger onto a background area of FIG. 4 and slid the finger to the right. A first house portal 47 displayed in FIG. 4 has moved out of the view and is not visible in FIG. 5. A second house portal 48 displayed on the right side of the view in FIG. 4 has moved to the left side of the view in FIG. 5 and now is only partially visible. A bank portal 49 that was not visible in FIG. 4 has moved into view from the right as illustrated in FIG. 5. The Agent 41 and Wayback portal 45 remain in the view in the same lower left and lower right positions respectively.

When the user Selects any portal from the Earth's surface Space 32 as depicted in FIGS. 4 and 5, the Selected portal anticipates to provide feedback to the user and the user interface moves the user to a Space associated with the Selected portal. For example, when a user at the Earth's surface Space 32 depicted in FIG. 4 Selects the first house portal 47, the house portal 47 anticipates and then the user interface moves the user to a house Space associated with the house portal 47. FIG. 6 illustrates a house Space 50 associated with the house portal 47 of FIG. 4.

The house Space 50 displayed in FIG. 6 consists of a house with the outer walls removed such that the individual rooms inside the house are visible. All of the rooms inside the house, such as the living room 54, bedroom 53, bathroom 55, attic 52, and kitchen 56 depicted in FIG. 6, are portals that can be Selected by the user. As illustrated in FIG. 6, the Wayback portal 45 contains a miniature snapshot of the Earth's surface Space 32, as it appeared when the user left the previous Space. Thus the Wayback portal 45 depicted in FIG. 6 not only contains a miniature view of the Earth's surface Space, but a view of that portion of the Earth's surface Space 32 that was in view when the user Selected the house portal 47 of FIG. 4. To move back up to the Earth's surface Space of FIG. 4, the user Selects the Wayback portal 45 that contains a snapshot image of the Earth's surface Space.

Referring to FIG. 6, if the user Selects the living room portal 54, the living room portal 54 anticipates, the "move through portal" sound is generated, and the user interface moves the user to a living room Space associated with the living room portal 54. Referring to FIG. 7, an embodiment of a living room Space 60 is depicted. Within the living room Space 60 of FIG. 7 is a television 73, a video cassette recorder 75, and a television program schedule book 71. The television 73, video cassette recorder 75, and television program schedule book 71 are each portals that can be Selected by the user. The television 73 and the video cassette recorder 75 portals are associated with a real television and video cassette recorder respectively.

When a user Selects the television portal 73 displayed within the living room Space 60 of FIG. 7, the television portal 73 anticipates and the user interface displays a graphical user interface associated with the real television. FIG. 8 depicts the television control Space 64 which comprises the television's graphical user interface in the present embodiment. The objects available in the television Space 64 include a green "on" button 61, a red "off" button 62, and several television channel buttons 66–69. The television channel buttons 66–69 are on a horizontally aligned object wheel 63 such that a user can Spin the object wheel 63 left or right in order to reveal additional television channel buttons that are not currently displayed on the display screen.

The on button 61, off button 62, and television channel button 66–69 objects available in the television Space 64 are not portals that give access to other Spaces in the Space map of FIG. 1b. Instead, the on button 61, off button 62, and television channel buttons 66–69 are buttons that are associated with functions. For example, the green "on" button 61 and red "off" button 62 are associated with the functions "turn the television on" and "turn the television off" respectively. When a user Selects either the on or off button, the button anticipates to provide feedback to the user that the button was Selected. The hand-held display device then transmits the appropriate commands that turn the television on or off. Similarly, if the user Selects any of the television channel buttons 66–69, the television channel button anticipates and the hand-held display device transmits the appropriate commands to the real television thereby tuning the television to the Selected channel. The process of transmitting commands to the physical television set is explained in detail in the following section.

Figure 9:
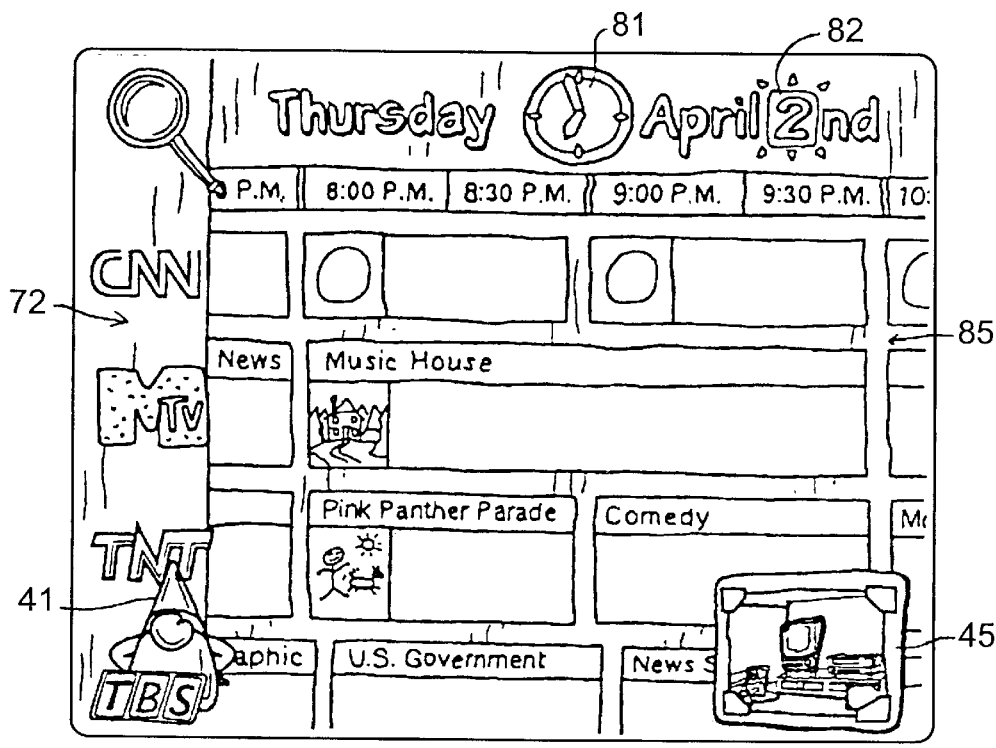
FIG. 9 illustrates a view of a television program listing book Space in the user interface based upon the geographic map structure in FIGS. 2b and 2c.

Referring back to FIG. 7, if a user Selects the television program schedule book portal 71, the television program schedule book portal 71 anticipates, and the user interface moves the user to the television program schedule Space. FIG. 9 depicts the television program schedule book Space of the present embodiment. In the television program schedule book Space of FIG. 9, the user is presented with a two dimensional array of television program listings. The array organizes the television program listings vertically by television channel and horizontally by time. Each television program listing is a portal that can be Selected by the user. Each television program listing can also be carried by the user and Dropped onto the video cassette recorder portal such that the hand-held display device programs the video cassette recorder to record the television program.

Figure 11:
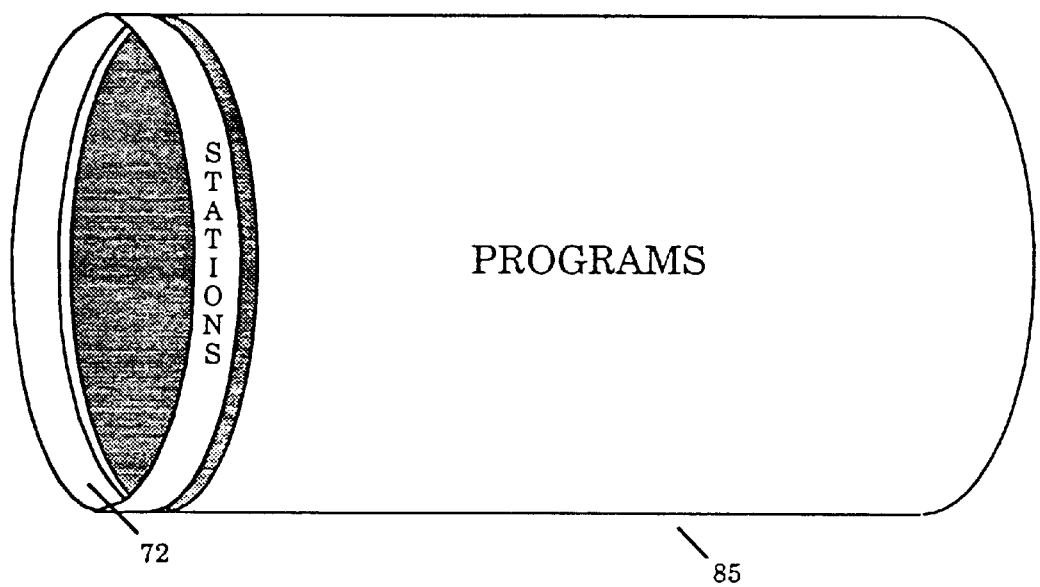
FIG. 11 illustrates a conceptual view of the television program listing book Space of FIG. 9.

The television program schedule book Space of FIG. 9 is actually organized as a pair of connected vertically oriented object wheels. Referring to FIG. 11, a conceptual diagram of the television program schedule book Space is illustrated. The television channels of FIG. 9 are placed on a first object wheel 72 as illustrated in FIG. 11. The television program listings are placed a second object wheel 85. The two object wheels 72 and 85 are connected such that if the user Spins either object wheel, the other object wheel will spin at the same rate such that the television channels and television program listings are always aligned.

Figure 10:
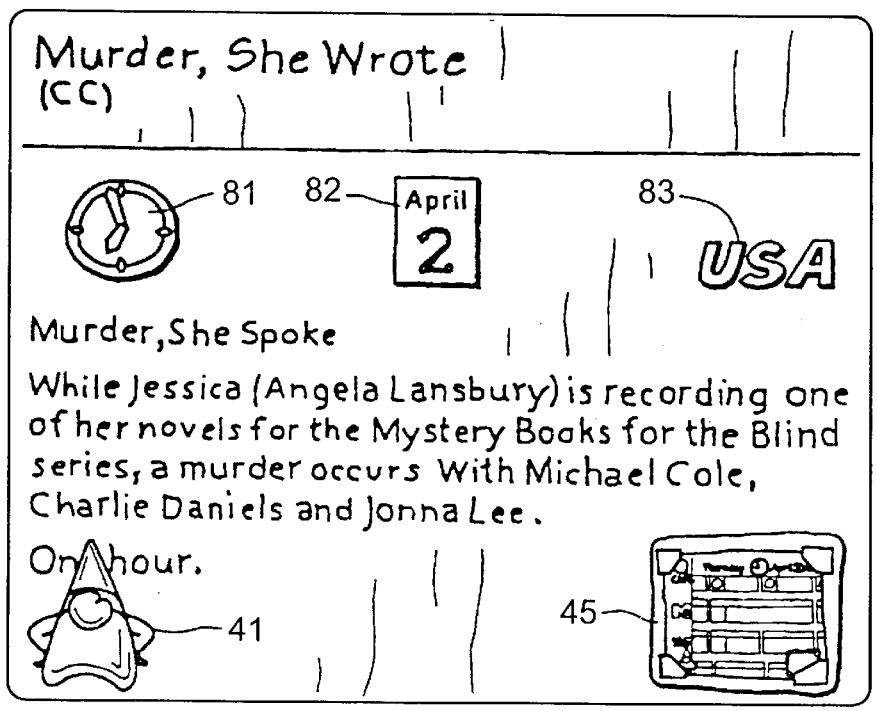
FIG. 10 illustrates a view of a single television program description Space of the user interface based upon the geographic map structure in FIGS. 2b and 2c.

Each television program listing on the television program schedule object wheel 85 is a portal. When a user Selects one of the television program listing portals, the television program listing portal anticipates and the user interface moves the user to a television program information Space. FIG. 10 illustrates a typical television program information Space. The television program information Space includes a dock 81, a date 82 and television channel 83 which inform the user when the television program is on and what channel the television program is on. The television program information Space also includes a description of the television program as illustrated in FIG. 10.

The Agent

The Agent is an anthropomorphic character designed to help a user of the present invention in a number of ways. The Agent assists users by providing help, providing state information, alerting the user to certain events, and acting as a repository. Each function performed by the Agent will be explained individually.

Help

As previously described in the tour of the present embodiment, with reference to FIG. 3, when a user. first enters the user interface of the present invention, the Agent demonstrates how to use the Point gesture and the Select gesture. Furthermore, the Agent demonstrates how to use the Pan gesture to move around within a Space. The Agent can also demonstrate how to use other features of the user interface as necessary.

To further aid users, the Agent carries a help manual in its briefcase that is available to the user at any time. To access the help manual, the user simply Selects the Agent portal. The Agent anticipates by providing an animation of the Agent opening up its briefcase. The user then Selects the help manual from within the Agent's briefcase.

State and Mode Information

The Agent is also used to express the current state or mode of the user interface. To express the current state or mode the Agent changes its clothing, changes its expression, or changes the props it is carrying.

Figure 17A:
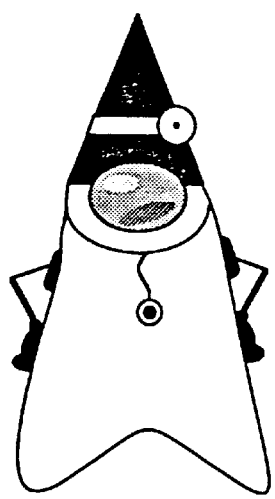
FIG. 17a illustrates the Agent Portal of the present invention wearing a doctor's uniform to symbolize a diagnostic mode.

For example, if the user interface of the present invention is placed into a diagnostic mode, the clothing that the Agent is wearing is changed to convey this fact. Referring to FIG. 17a, the Agent is shown in a doctor's uniform to symbolize that the user interface is in a diagnostic mode.

Figure 17B:
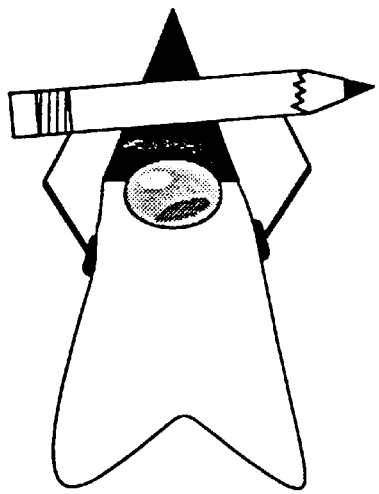
FIG. 17b illustrates the Agent Portal of the present invention holding a pencil to symbolize a writing mode.

FIG. 17b provides another example of how the Agent's appearance can convey state information. When the user is in a writing state, the Agent is given a pencil to symbolize that the user interface is in a writing state.

Alerts

While a user is using the hand-held display device of the present invention, certain events may occur that require the user to be informed immediately. Such events are usually referred to as alerts. For example, if the hand-held display device is coupled to an electronic messaging service, the hand-held display device should alert the user when a message has been received that is addressed to the user.

In the user interface of the present invention, the Agent is used to obtain the user's attention in order to inform the user about any alerts. To get the user's attention the Agent waves its hand. Additionally, if the alert is very important, the Agent may wave both arms or produce sounds to further attract the user's attention.

Figure 17C:
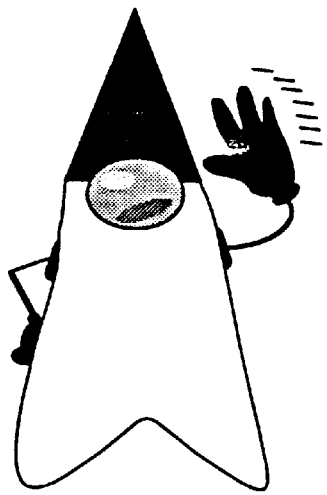
FIG. 17c illustrates the Agent Portal of the present invention attempting to alert the user about a recent event.

For example, when an event occurs that requires the user's attention, the Agent begins waving as illustrated in FIG. 17c. To explain what caused the alert, the Agent's appearance may be further altered as demonstrated in the previous section in order to convey information about the specific alert. For example, when an urgent message arrives, the Agent can wave with one hand while holding a telegram in the other hand.

Since alerts are generally more important than state or mode information, alerts will take precedence over state or mode information. Therefore, if the image of the Agent is currently being used to convey state or mode information when an important event occurs, the image of the Agent will change to get the user's attention and inform the user about the alert. For example, if the Agent is holding a pencil while in writing mode, as illustrated in FIG. 17b, when an urgent message arrives, the Agent will immediately change to the waving animation as illustrated in FIG. 17c to inform the user about the message.

Remote Device Control

The hand-held display device of the present invention is designed to control remote devices. Accordingly, the user interface defined in the previous section for the hand-held display device is designed to be an ideal graphical user interface for controlling remote devices. For example, to control a device in the user's living room, a user first moves to the living room Space 60 of the user interface as illustrated in FIG. 7. The user then Selects an object corresponding to a device that the user wishes to control. For example, if the user desires to control a television, the user Selects the television portal 73 associated with a real television. When the user Selects the television portal 73, the television portal 73 anticipates and then displays a graphical user interface for controlling the physical television in the user's living room. FIG. 8 illustrates one possible embodiment of a set of television controls for controlling a television. The user then controls the television using the set of television controls displayed on the hand-held display device.

In order for a remote device to be controlled by the hand-held display device, the hand-held display device must have certain information about the remote device. Specifically, the hand-held display device must be provided with an object-oriented programming type of object that is associated with the remote device. The object comprises a plurality of methods including a method for displaying the object on the display screen of the hand-held display device and a method for displaying a graphical user interface for the remote device.

To simplify the operation of the present invention, each compatible remote device automatically transmits the required object-oriented programming type of object to the hand-held display device. When a remote device transmits the object to the hand-held display device, the hand-held display device invokes the method for displaying the object on the display screen. The user can then move the object to an appropriate Space. If the user Selects the object, the Selected object anticipates and then the method for displaying the graphical user interface is invoked. The method displays the remote device's graphical user interface on the hand-held display device's touch screen display. The user can then control the remote device by interacting with the remote device's graphical user interface displayed on the touch screen display.

The hand-held display device of the present invention automatically obtains a graphical user interface from two types of compatible remote devices. The first type of compatible remote device is the intelligent remote device with a dedicated computer control system. The second type of compatible remote device is a simple remote device that can only respond to simple coded commands.

The hand-held display device interacts differently with the two types of compatible remote devices. The hand-held display device communicates with intelligent remote devices using peer-to-peer communication with remote method invocation for remote device control. The hand-held display device communicates with simple remote devices using only simple control codes. However, from the user's perspective the differences between the intelligent remote devices and the simple remote devices cannot be seen, and the user's interaction with the graphical user interface is identical for both types of remote devices. The implementation detail of whether a user's actions cause a remote method invocation, or transmission of control codes through some communication mechanism is hidden from the user.

This section will explain how the two types of compatible remote devices transmit information to the hand-held display device. Furthermore, a third type of remote device will explained. The third type of device consists of any electrical device that can be controlled by coded infrared signals.

Within this section, reference will be made to object-oriented programming type objects. Each object-oriented programming type of object contains data and methods that can be invoked to perform functions. To simplify the terminology used, the term "program object" will be used when referring to an object-oriented programming type of object. To eliminate confusion, the objects displayed on the touch screen display in the user interface disclosed in the previous user interface will be referred to as "display objects" in this section.

Peer to Peer Communication With Remote Method Invocation

In the present invention, a remote device is defined as an "intelligent remote device" if that remote device contains a microprocessor, a communication system, and a sufficient amount of memory such that it can invoke methods in a program object. FIG. 1c illustrates, in block diagram form, the components in an intelligent remote device. The hand-held display device of the present invention communicates with intelligent remote devices in a peer-to-peer fashion.

The intelligent remote device has an associated graphical user interface comprising touch screen control elements such as dials, switches, sliders, etc. The intelligent remote device's graphical user interface is defined within a user interface program object 303 stored in the intelligent remote device's memory 404. When an intelligent remote device is first turned on, the intelligent remote device automatically transmits its user interface program object 303 to the hand-held display device. The hand-held display device can then display the user interface for the intelligent remote device as defined by the user interface program object.

When a user interacts with the intelligent remote device's graphical user interface as displayed on the hand-held display device, the hand-held display device invokes methods in a device driver program object 301 within the intelligent remote to control the remote device. Thus the software that actually "controls" an intelligent remote device is located within the intelligent remote device itself.

Figure 18A:
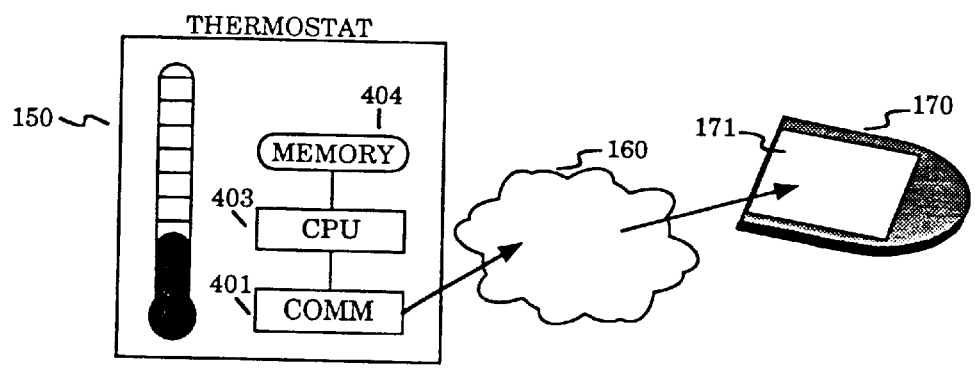
FIG. 18a illustrates an intelligent device transmitting its graphical user interface to a display device.
Figure 18B:
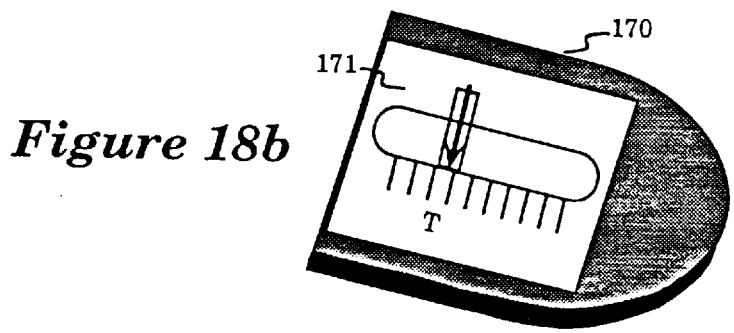
FIG. 18b illustrates a display device displaying the graphical user interface of an intelligent controllable device.
Figure 18C:
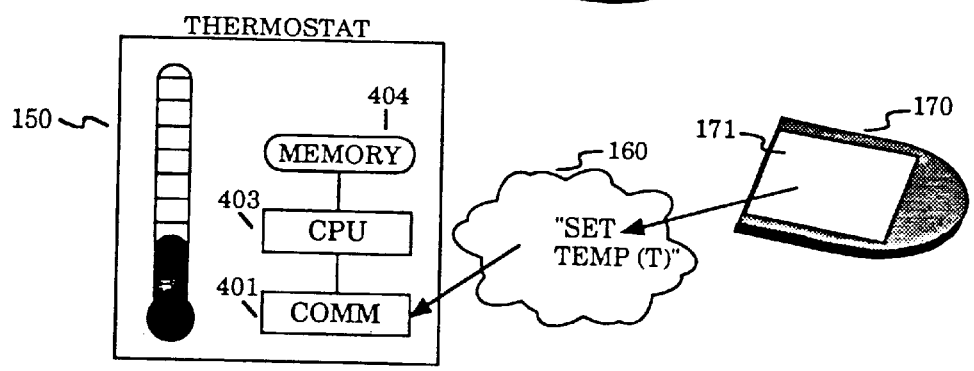
FIG. 18c illustrates the display device transmitting user interactions with the user interface to the intelligent device.
Figure 18D:
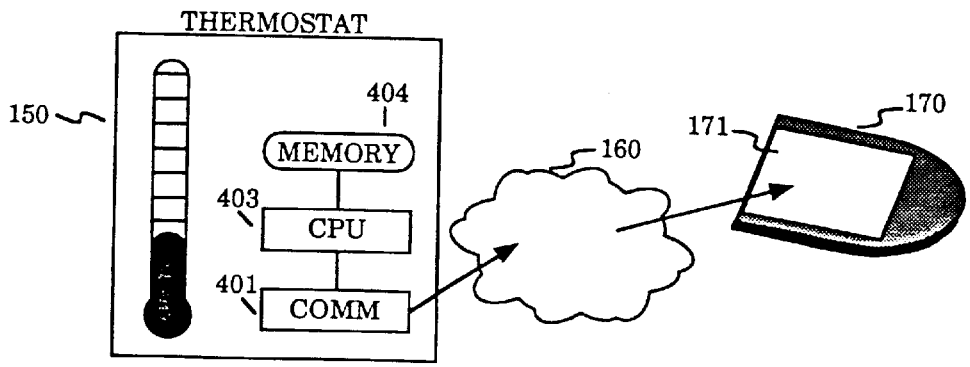
FIG. 18d illustrates the intelligent device transmitting return values or feedback to the display device.
Figure 19A:
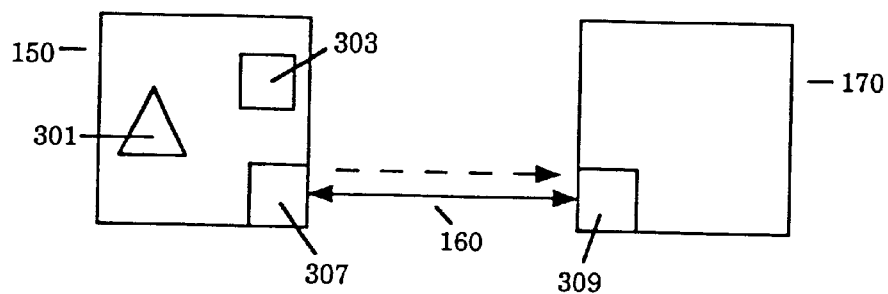
FIG. 19a illustrates a conceptual diagram of the program objects in the intelligent device being sent to the display device.
Figure 19B:
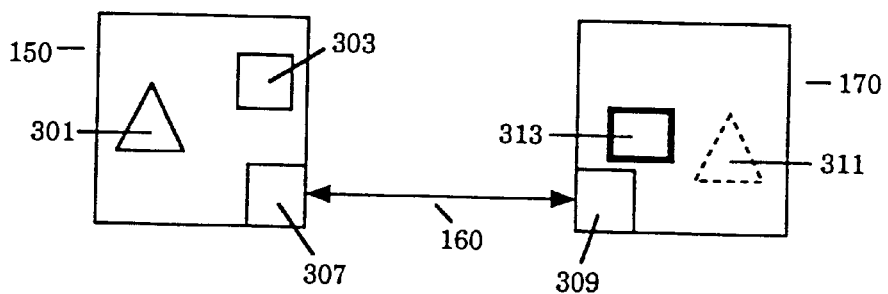
FIG. 19b illustrates a conceptual diagram of the program objects of the intelligent device in the display device.
Figure 19C:
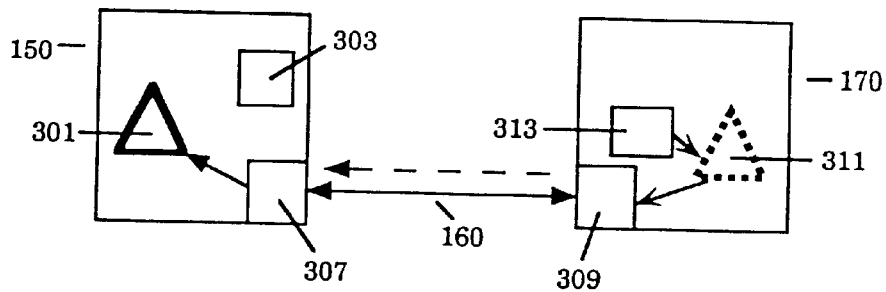
FIG. 19c illustrates a conceptual diagram of the display device invoking a method in an object within the remote intelligent device.
Figure 19D:
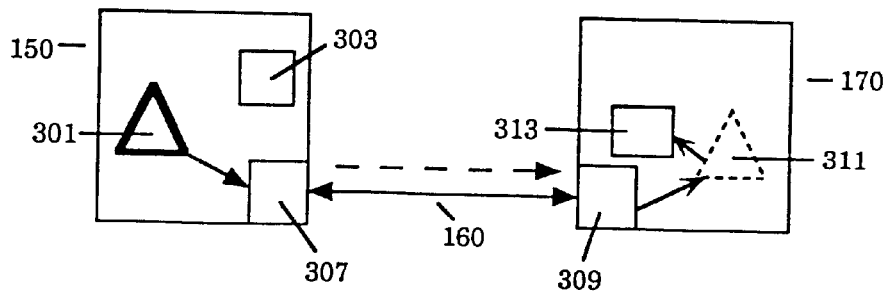
FIG. 19d illustrates a conceptual diagram of the method in an object within the remote intelligent device returning status.
Figure 20:
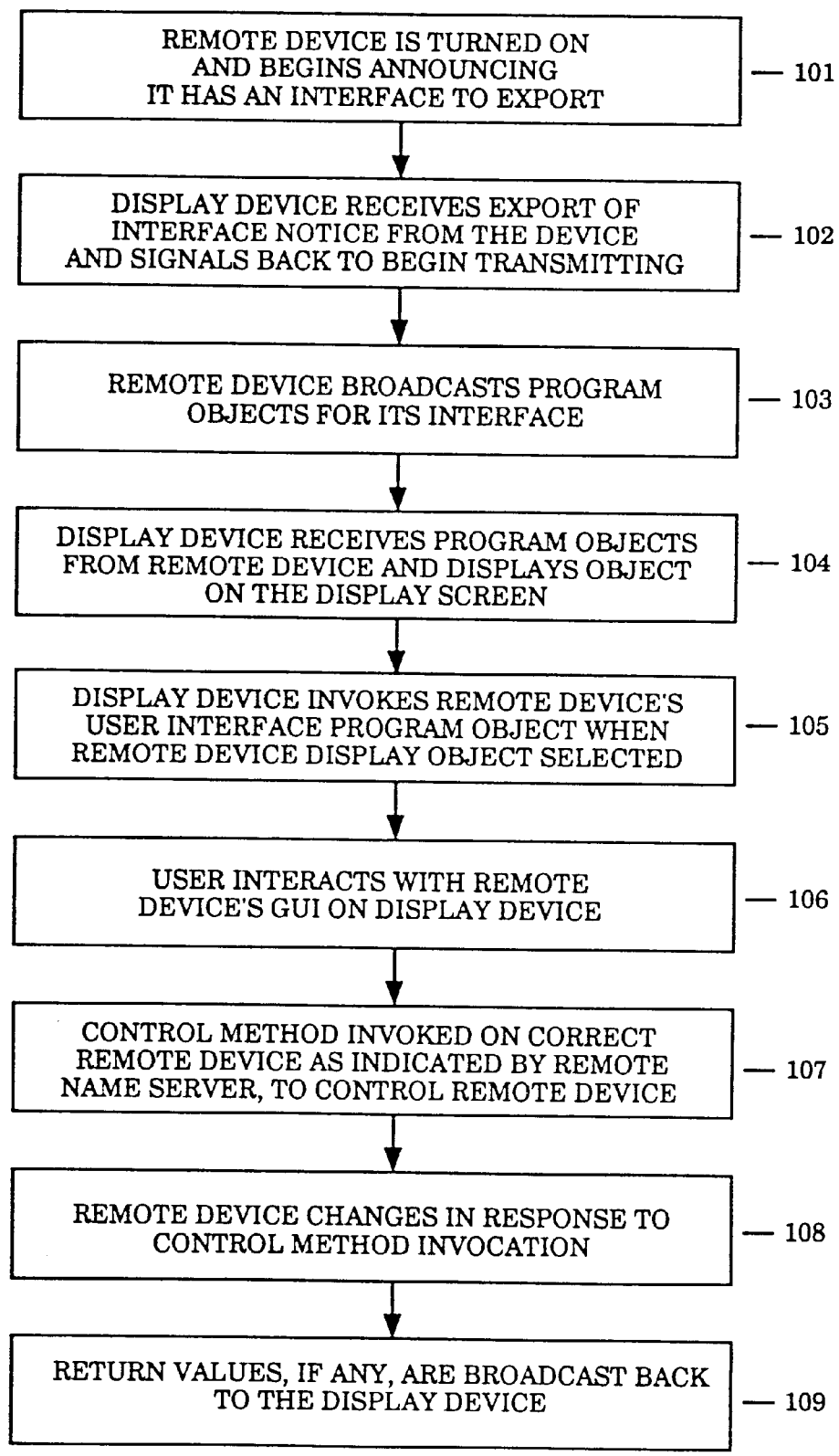
FIG. 20 illustrates a flowchart of the transfer of an intelligent device's user interface.

The procedure of transmitting the user interface object 303 from an intelligent remote device to the hand-held display device will be disclosed with reference to FIGS. 18a–18d, 19a–19d and the flowchart in FIG. 20. FIGS. 18a–18d illustrate, on a high level, how the intelligent remote device 150 and the hand-held display device 170 of the present invention communicate with each other. FIGS. 19a–19d illustrate, in conceptual form, how the user interface program object 303 in the intelligent remote device 150 is transmitted to the hand-held display device 170.

Referring to step 101 of FIG. 20, when a new intelligent remote device 150, such as the intelligent thermostat control device in FIG. 18a, is first turned on, the new intelligent remote device 150 broadcasts across the communications network 160 that it has a user interface program object to export. As set forth in the hardware section, the communication on the communications network 160 can take place using radio waves, low power, cellular, infrared signals, or electrical signals on existing power lines in the case of an Echelon® base LON® system. In step 102, a hand-held display device 170 receives the interface export message. The hand-held display device 170 signals back across the communications network 160 to the new intelligent remote device 150 requesting the new intelligent device 150 to begin transmitting the user interface object 303.

The intelligent remote device 150 then transmits the user interface object 303 to the display device 170 as specified in step 103 of FIG. 20 and illustrated in FIG. 18a. Referring to FIG. 19a, the intelligent remote device 150 also transmits a pointer (as indicated by dotted lines) to a device driver program object 301 within the intelligent remote device 150. The user interface program object 303 defines how the user interface for the intelligent remote device 150 should appear on a display screen. The user interface program object 303 invokes methods in a device driver program object 301 to handle user interface interactions. The device driver program object 301 contains methods that control the actual intelligent remote device 150. Referring to FIG. 19b, the display device 170 now has a copy of the intelligent device's user interface program object 313 and a device driver program object 311 pointer.

After receiving the user interface program object 313, the hand-held display device 170 invokes a method in the user interface program object 313 that renders a display object in the current Space as stated in step 104. The new intelligent device 150 also registers with a remote name server connected to the communications network 160.

When a user Selects the display object associated with the new intelligent remote device 150, the hand-held display device 170 invokes a method in the user interface program object 313 as stated in step 105 (the object with an invoked method is shown in bold). The method invoked in the user interface program object 313 displays the remote intelligent device's graphical user interface on the display screen 171 of the display device 170 as illustrated in FIG. 18b. A user can interact with the remote intelligent device's graphical user interface displayed on the display device 170 as stated in step 106.

The user controls the intelligent remote device 150 by interacting with the graphical user interface displayed on the hand-held display device 170. To resolve the user's interactions, the user interface program object 313 requires control methods in the intelligent remote device's device driver program object 301. To access the control methods in the intelligent remote device's device driver program object 301, the hand-held display device 170 uses the device driver program object pointer 311. The device driver program object pointer 311 invokes the methods in the real device driver program object 301. The intelligent remote device's device driver program object 301 is invoked by sending a message over the communication network 160 as illustrated in FIGS. 18c and 19c (again, the object with an invoked method is shown in bold). The methods invoked in the intelligent remote device's device driver program object 301 control the intelligent device 150 as stated in step 108.

Finally, in step 109, any return values or feedback generated by the device driver program object 301 in intelligent remote device 150 are sent back to the hand-held display device 170 over the communications network 160 as illustrated in FIGS. 18d and 19d. The user interface program object 313 changes the graphical user interface on the display screen 171 in response to the return values or feedback received from device driver program object 301 in the intelligent remote device 150.

A robust communication protocol across the communications network 160 is required to communicate remote method invocations between the hand-held display device 170 and the intelligent remote device 150. Both the hand-held display device 170 requesting the method invocation and the intelligent remote device 150 that executes the method must be able to handle a broken communication path. Therefore, both the hand-held display device 170 and the intelligent remote device 150 have a dedicated remote procedure call (RPC) manager that handles the remote method invocation. Referring to FIGS. 19a–19d, the remote procedure call manager 309 transmits the remote method invocation request for the hand-held display device 170. On the other side, a server remote procedure call manager 307 processes the received remote method invocation in an intelligent remote device 150.

Figure 21A:
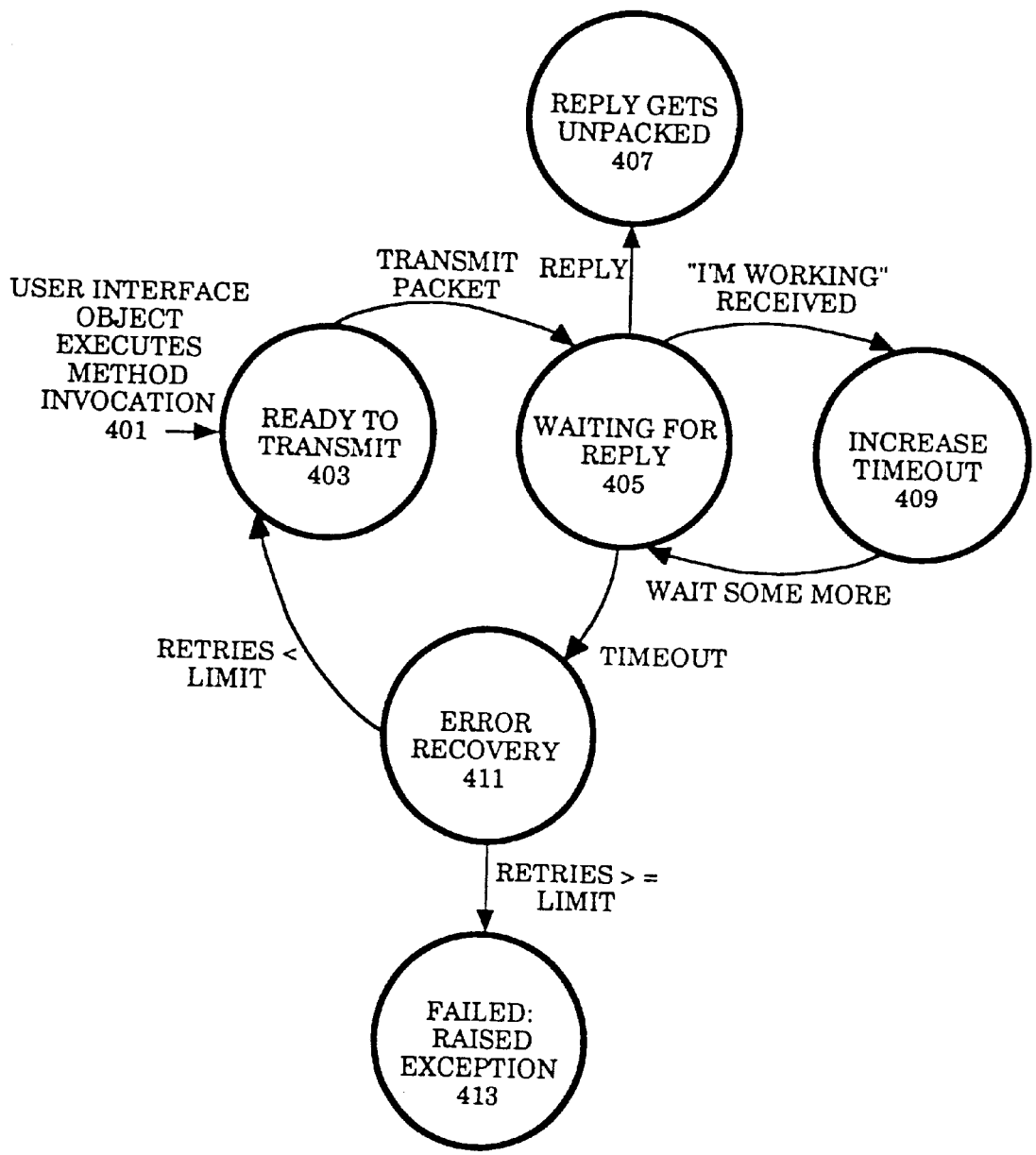
FIG. 21a illustrates a state diagram of the RPC manager for a client requesting a remote method invocation.
Figure 21B:
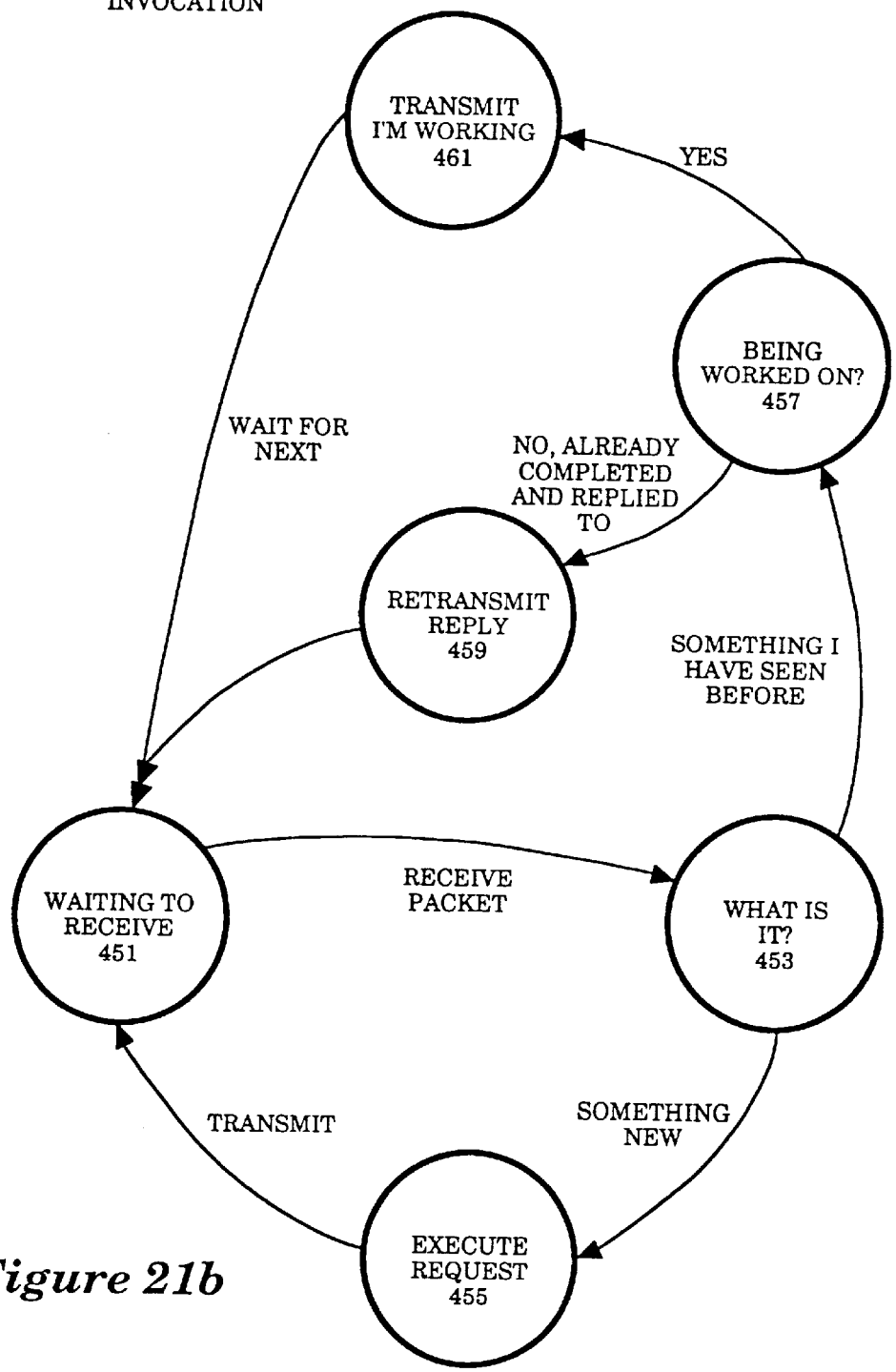
FIG. 21b illustrates a state diagram of the RPC manager for a server handling a remote method invocation.

FIGS. 21a and 21b illustrate state diagrams used to control the remote procedure call (RPC) managers that handle the remote method invocation on both the hand-held display device 170 side and the remote device side. Taken together, state diagrams in FIGS. 21a and 21b disclose a handshake used between the hand-held display device 170 and an intelligent remote device 150 to ensure reliable communications.

FIG. 21a illustrates a state machine for the remote procedure call manager 309 in the hand-held display device 170 that handles the display device's side of a remote method invocation. In the present invention, the user interface program object 313 in the hand-held display device 170 requests remote method invocations to the device driver program objects 301 located in remote intelligent devices. Referring to FIG. 21a, when a user interface object requests a remote method invocation, the hand-held display device's RPC manager enters the "ready to transmit" state 403. The display device's RPC manager then sets an error countdown timer and transmits a packet containing a message with a method selector and associated data. After transmitting the packet, the display device's RPC manager enters a "waiting for reply" state 405. If the proper reply message is sent back, the method invocation is complete and the reply message is analyzed at state 407.

Remote method invocations do not always complete so easily. If the device driver program object 301 in the intelligent remote device 150 needs more time to complete the method, it will send back a message requesting more time. The display device's RPC manager responds by moving to state 409 where it increases the timeout value. If the display device's RPC manager does not receive a reply by the time the error countdown timer expires, the display device's RPC manager moves to an "error recovery" state 411. If the error countdown timer expires less than a predetermined number of times, the display device's RPC manager returns to the "ready to transmit" state 403. If the error countdown timer reaches a predetermined limit, the display device's RPC manager abandons the remote method invocation and enters a failed state 413. The user is then usually 2informed of the communications problem.

FIG. 21b illustrates a state machine for a remote procedure call manager 307 in an intelligent remote device that handles the remote device's side of a remote method invocation. The remote device's RPC manager 307 starts in a "waiting to receive" state 451. When a packet is received, the remote device's RPC manager analyzes the packet at state 453. If the received packet contains a new message requesting a method invocation, the remote device's RPC manager gives the packet to an object that performs the method of the request at state 455. The remote device's RPC manager then transmits a result and returns to the waiting state 451.

If the received packet contains a message that the remote device has already seen, the RPC manager of the intelligent remote device moves to state 457 where the intelligent remote device determines whether the method invocation request was already completed or whether it is still working on the request. If the intelligent remote device has already completed the request, the subsystem retransmits the results at state 459 and returns to the waiting state 451. Otherwise, if the intelligent remote device is still working on the method invocation, the remote device's RPC manager moves to state 461 where the remote device's RPC manager requests more time to complete the invoked method and then returns to the waiting state 451.

Figure 21C:
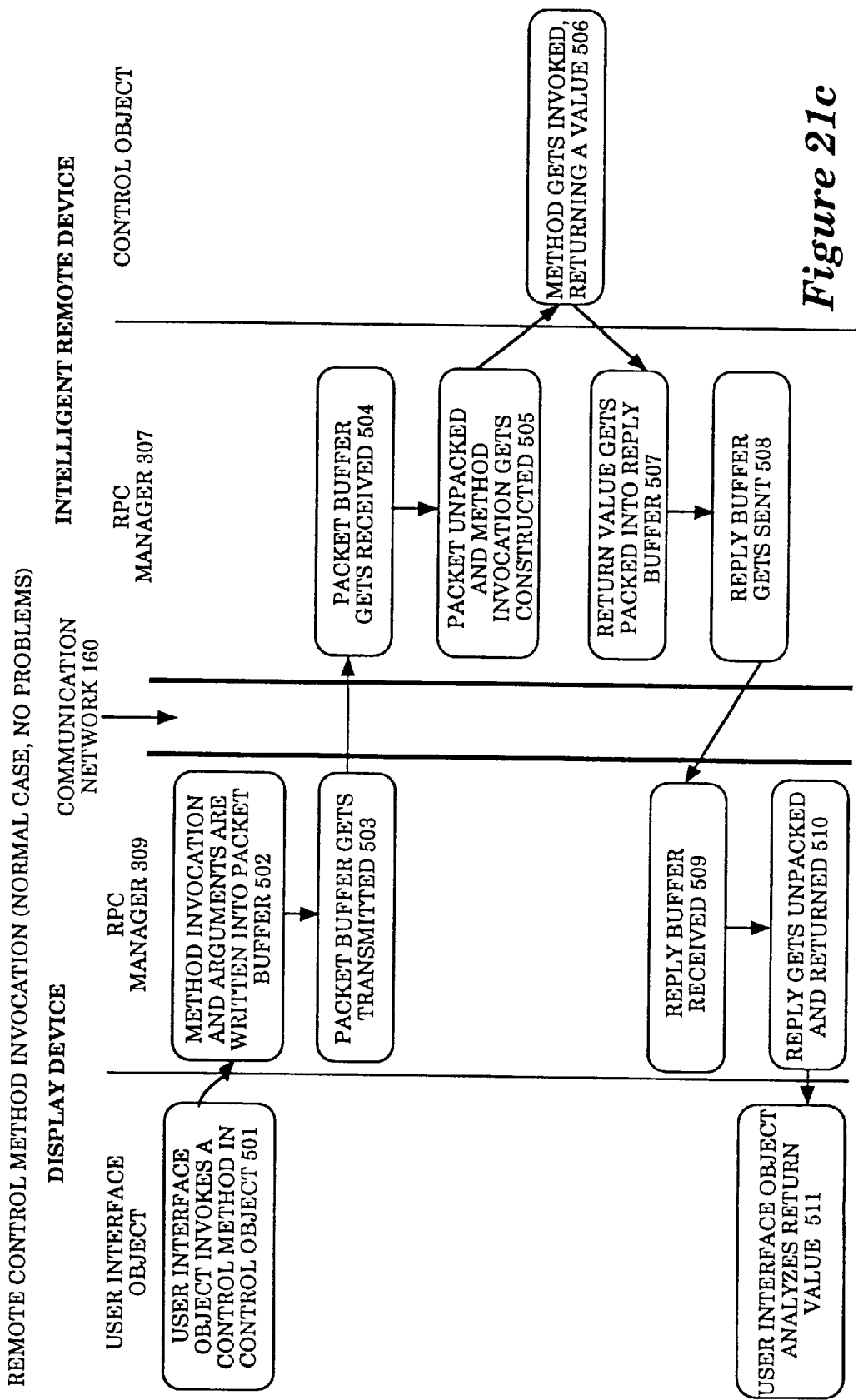
FIG. 21c illustrates the sequence of a remote method invocation.

FIG. 21c illustrates the sequence of a remote method invocation where there are no communication problems. At step 501, a user interface object in the hand-held display device requests a remote method invocation. Therefore, the user interface object sends a message with a method selector and argument to the display device's RPC manager. The display device's RPC manager packs the message received into a packet at step 502 and transmits the packet across the communications network at step 503.

The intelligent remote device's RPC manager receives the transmitted packet at step 504. The remote device's RPC manager unpacks the message from the packet at step 505 and directs the packet to the device driver program object within the intelligent remote device. The device driver program object invokes the method specified by the method selector in the message at step 506. The device driver program object generates a return message that is passed back to the remote device's RPC manager. At step 507, the remote device's RPC manager packs the return message into a reply buffer. The remote device's RPC manager sends the reply buffer at step 508.

The display device's RPC manager receives the reply buffer at step 509 and unpacks the reply buffer to extract a return value at step 510. The display device's RPC manager delivers the return value to the requesting user interface program object that invoked the method in the device driver program object. Finally, the user interface program object analyzes the return value at step 511.

As illustrated, the present invention can control an intelligent remote device by remotely invoking methods in a device driver program object located within the intelligent remote device. In addition, it will be appreciated by the reader that the remote device may also remotely invoke methods in the display device. For example, the device driver object in a remote device may invoke a method in a user interface object in the display device to display a message.

Many remote devices are not sophisticated enough to have internal control methods that can be invoked by the display device. Therefore, the present invention provides other methods for controlling simple devices.

Simple Device Control

In the present invention, a remote device is defined as a "simple device" if the remote device does not have a microprocessor or the remote device contains such a primitive processor that the display device can not invoke control methods within the remote device. FIG. 1d illustrates, in block diagram form, the components in a simple remote device. To control a simple device, the hand-held display device of the present invention transmits simple predefined control codes instead of invoking control methods within the simple remote device. Therefore, to control a simple remote device, the hand-held display device must obtain both a user interface program object and a device driver program object from the simple remote device.

Figure 22A:
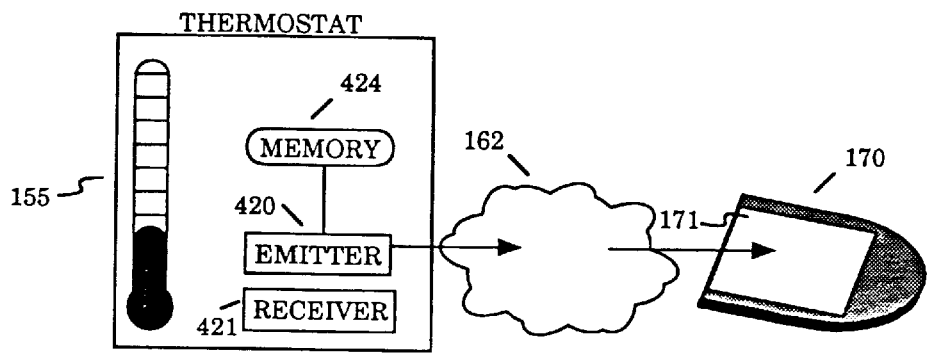
FIG. 22a illustrates the simple device transferring its graphical user interface to a display device.
Figure 22B:
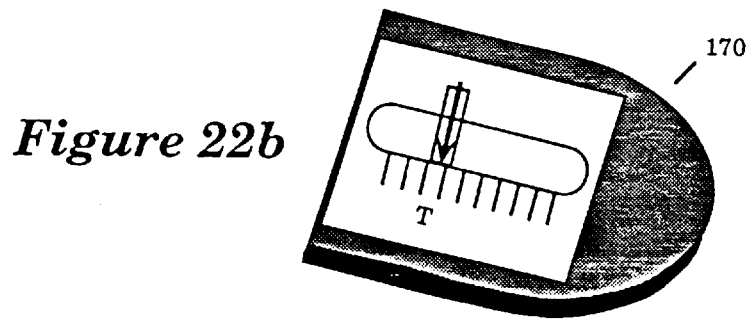
FIG. 22b illustrates a display device displaying the graphical user interface of the simple controllable device.
Figure 22C:
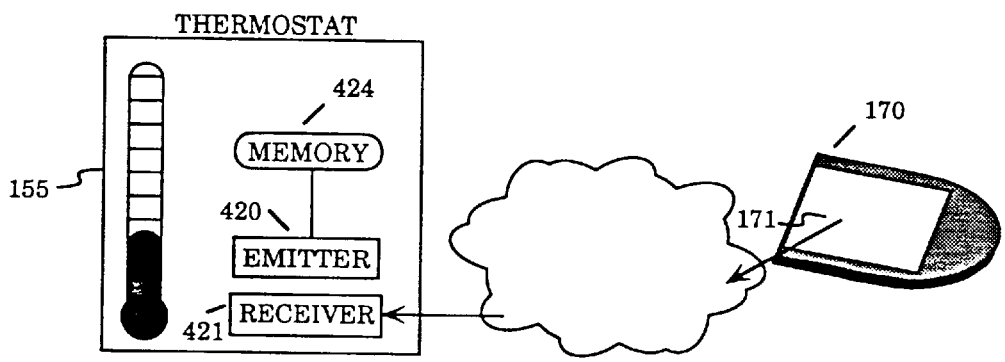
FIG. 22c illustrates the display device transmitting simple control codes to the simple device.
Figure 22D:
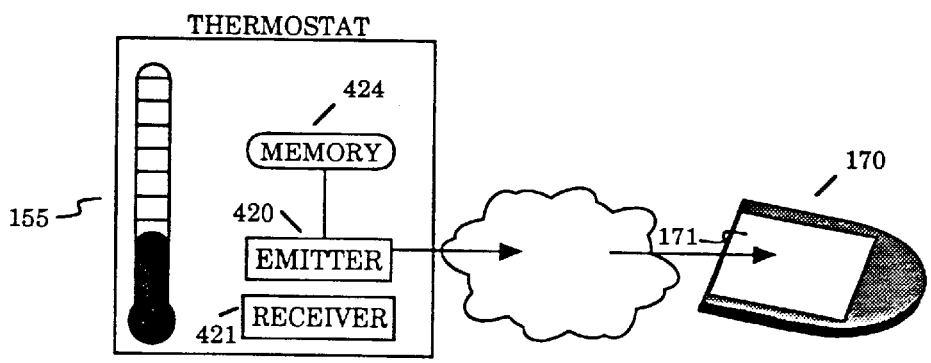
FIG. 22d illustrates the simple device transmitting return values or feedback to the display device.
Figure 23A:
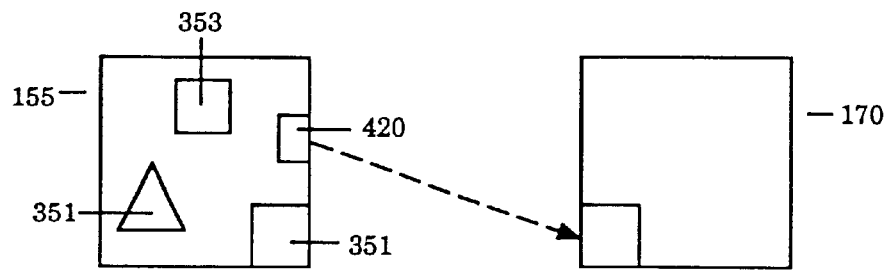
FIG. 23a illustrates a conceptual diagram of the program objects in a simple device being sent to the display device.
Figure 23B:
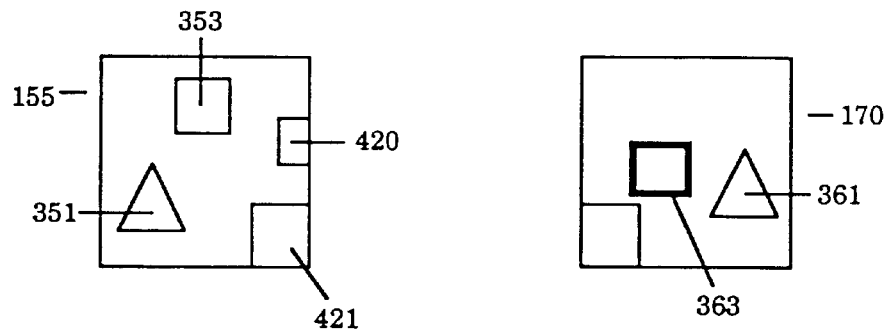
FIG. 23b illustrates a conceptual diagram of the program objects of the simple device in the display device.
Figure 23C:
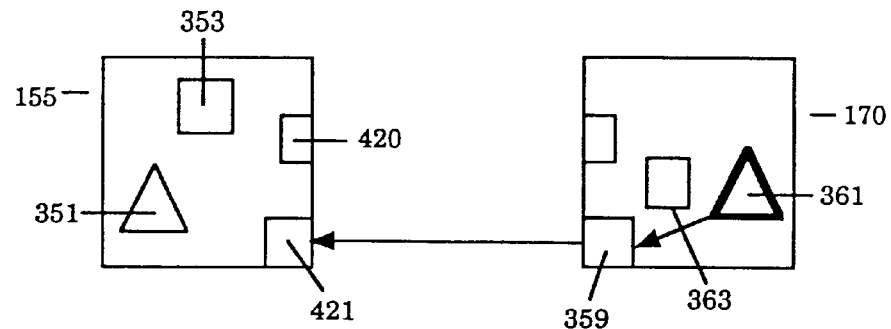
FIG. 23c illustrates a conceptual diagram of the display device invoking a method in a program object and transmitting control codes to the simple device.
Figure 23D:
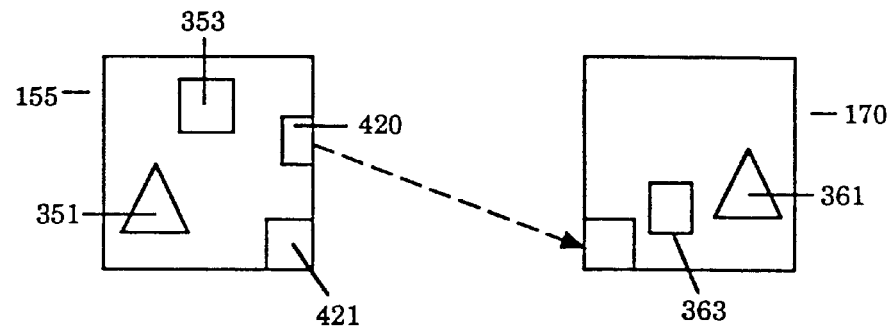
FIG. 23d illustrates a conceptual diagram of the remote simple device returning status information.
Figure 24:
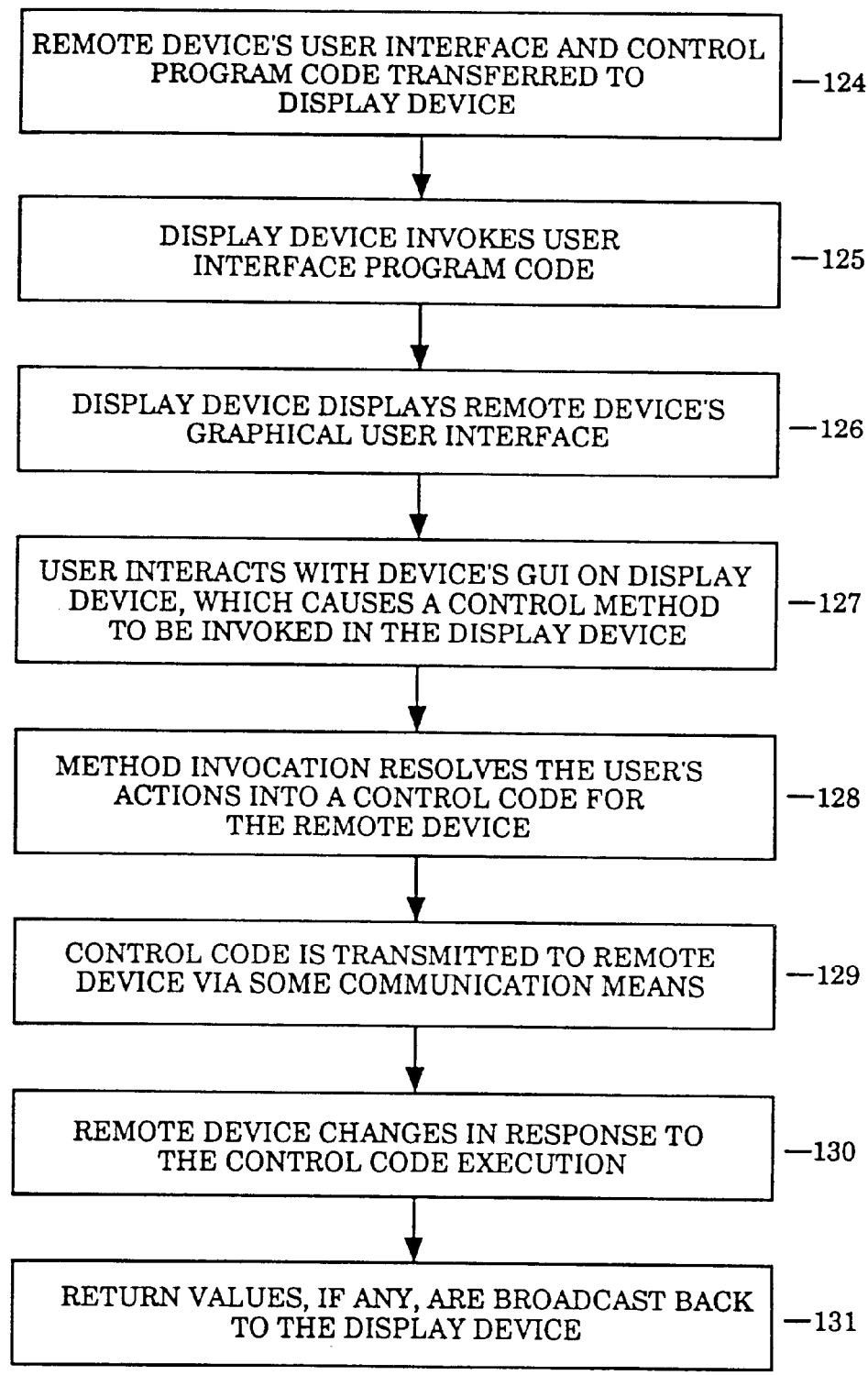
FIG. 24 illustrates a flowchart of the transfer of a simple device's user interface.

An example of obtaining user interface program object and a device driver program object from a simple remote device is given with reference to FIGS. 22a–22d, 23a–23d and the flowchart in FIG. 24. FIGS. 22a–22d illustrate on a high level how the remote simple device 155 and the hand-held display device 170 of the present invention communicate with each other. FIGS. 23a–23d illustrate, in conceptual form, how the user interface program object 353 and the device driver program object 351 of the remote external device 150 are transported the hand-held display device 170 and used.

Referring to FIG. 22a, a thermostat implemented as a simple remote device 155 is illustrated. As specified by step 124 of FIG. 24, the simple remote device 155 of FIG. 22a transmits both a user interface program object and a device driver program object to the hand-held display device 170. Illustrated conceptually in FIG. 23a, the simple device 155 transmits the user interface program object 353 and the device driver program object 351. The transmission of the program objects is done using some communications means 162 that may be a communications network or any other means of transferring the information into the display device 170.

The hand-held display device 170 receives the copy of the user interface program object 363 that describes the simple device's graphical user interface. The hand-held display device 170 then invokes a method in the user interface program object 363 that renders a display object within a Space shown on the hand-held display device 170. When a user Selects the display object associated with the simple remote device 155, the display device 170 invokes a method within the user interface program object 363 as stated in step 125 of FIG. 24 and illustrated in FIG. 22b. The method invoked in the user interface program object 363 displays a graphical user interface associated with the simple remote device on the display screen 171 of the display device 170. The user can then interact with simple remote device's graphical user interface on display device 170 as stated in step 127.

The user's interactions with the simple device's graphical user interface are analyzed by the simple device's device driver program object 361 within the display device 150. The device driver program object 361 resolves the user's interactions into control codes that the simple remote device 155 will respond to. As illustrated in FIG. 23c, the device driver program object 361 located within the display device 170 analyzes the user's actions.

Referring to FIGS. 22c and 23c, the hand-held display device 170 transmits the control codes to the simple remote device 155. The simple remote device 155 changes in response to the control codes received as stated in step 130. Finally, if the simple remote device 155 and the display device 170 are coupled together by a communications network, the simple device 155 can transmit any return values or feedback generated by the simple remote device 155 as illustrated in FIG. 22d.

Conventional Device Control

Existing remote devices that are not designed for the hand-held display device of the present invention do not have a user interface program object to transmit to the hand-held display device. For example, FIG. 1e illustrates a typical existing remote device that can only respond to coded command signals such as infrared signals. In such cases, the hand-held display device must be manually informed about the remote device. The hand-held display device then uses a generic user interface program object for the type of remote device.

For example, if a user has a conventional television that is controlled by infrared signals, the user enters a model number of the television to inform the hand-held display device about the conventional television. The hand-held display device then accesses a database to obtain a list of the control codes that the conventional television will understands. A television display object is then created to control the conventional television. If the user selects television display object, the hand-held display device will invoke a method that displays a generic television user interface. When the user interacts with the generic television user interface, the display device will transmit the proper infrared control codes to control the television

SUMMARY

The foregoing has described an intuitive graphical user interface based upon a geographic map structure and a system for controlling remote external electronic devices. In the user interface of the present invention, each Space of the geographic map structure is rendered on a touch screen display as a Space. Within each Space are colored icons called "objects" that can be Selected and manipulated by the user. Certain objects, referred to as portals, transport the user from one Space to another Space when Selected. Other objects, referred to as buttons, perform associated actions or functions when Selected. The user interface is displayed on a hand-held display device that can control remote electronic devices. Each remote electronic device transmits a user interface program object that defines a graphical user interface to the display device. The hand-held display device displays the graphical user interface associated with the remote device when a user selects an icon associated with the remote device on the display device's touch screen display. It is contemplated that changes and modifications may be made by one of ordinary skill in the art, to the materials and arrangements of elements of the present invention without departing from the scope of the invention.

We claim:

1. In an object-oriented graphic user interface, said object-oriented graphic user interface illustrating objects as graphical icons, a method of providing information to a program object, said method comprising the steps of:

rendering a graphic image of a data object at an initial position on a graphics display screen;

receiving input from a user comprising a command to move said data object to a space linked to the program object;

receiving input from a user comprising a destination position on the graphics display screen to locate said data object, said program object located at said destination position;

rendering a ghost image comprising an exact copy of said graphic image of said data object drawn in muted colors of said data object at said initial position on said graphics display screen, wherein in response to the command to move said data object, said ghost image and said data object are moved together;

modifying the appearance of said program object to indicate that said program object will accept said data object;

receiving input from a user comprising a command to provide said data object to the space associated with said program object when the appearance of said program object has been modified; and merging said ghost image and said graphic image of said data object to provide feedback that the data object has been moved.

2. The method of providing information to a program object as claimed in claim 1, wherein said input comprises a finger touching a touch screen display.

3. The method of providing information to a program object as claimed in claim 2, further comprising the step of:

generating a tearing sound from a hand-held device, upon receiving said input comprising a command to move said object.

4. The method of providing information to a program object as claimed in claim 3, further comprising the step of:

generating a carrying sound from a hand-held device, after receiving said input comprising a command to move said object and before receiving said input comprising the destination position to locate said object.

5. The method of providing information to a program object as claimed in claim 1, further comprising the step of:

providing a plurality of spaces, each of said spaces comprising a graphic background image depicting a real-world scene familiar to users;

rendering on said graphics display screen a portal in at least one of said spaces, said portal having an associated target space such that said portal connects the space where the portal is disposed to the associated target space, said portal comprising a graphic icon; and wherein said input comprising the destination position to locate said object comprises holding said object over said portal for a predetermined minimum amount of time.

6. The method of providing information to a program object as claimed in claim 5, further comprising the step of:

rendering said ghost image in said associated target space.

7. The method of providing information to a program object as claimed in claim 6, wherein said input comprising the destination position to locate said object further comprises sliding a finger across said graphics display screen of a hand-held device to move said object from said initial position to said portal.

8. The method of providing information to a program object as claimed in claim 6, wherein said input comprising the destination position to locate said object comprises lifting said finger away from said graphics display screen of a hand-held device.

9. The method of providing information to a program object as claimed in claim 1 further comprising the step of:

providing an element for performing the step of highlighting said program object after receiving said input comprising a command to move said data object.

10. The method of providing information to a program object as claimed in claim 1, wherein said input comprising a second position to locate said data object further comprises sliding a finger across said graphics display screen to move said data object from said first position to said program object.

11. The method of moving an object in a graphical user interface as claimed in claim 10, wherein said input comprising a second position to locate said data object comprises lifting said finger away from said display screen.

12. The method of providing information to a program object as claimed in claim 1, wherein said input from the user further includes a command to copy said data object.

13. A computer-readable medium containing instructions, for controlling a data processing system to perform a method of providing information to a program object, said method comprising the steps of:

rendering a graphic image of a data object at an initial position on a graphics display screen;

receiving input from a user comprising a command to move said data object to a space linked to the program object;

receiving input from a user comprising a destination position on the graphics display screen to locate said data object, said program object located at said destination position;

rendering a ghost image comprising an exact copy of said graphic image of said data object drawn in muted colors of said data object at said initial position on said graphics display screen, wherein in response to the command to move said data object, said ghost image and said data object are moved together;

modifying the appearance of said program object to indicate that said program object will accept said data object;

receiving input from a user comprising a command to provide said data object to the space associated with said program object when the appearance of said program object has been modified; and merging said ghost image and said graphic image of said data object to provide feedback that the data object has been moved.

* * * * *

UNITED STATES PATENT AND TRADEMARK OFFICE
CERTIFICATE OF CORRECTION

PATENT NO. : 6,344,861 B1
DATED : February 5, 2002
INVENTOR(S) : Patrick J. Naughton et al.

It is certified that error appears in the above-identified patent and that said Letters Patent is hereby corrected as shown below:

<u>Title page,</u>
Item [75], in the named inventors, delete "R. Michael Sheridan, Oakton, CT (US)" and insert -- R. Michael Sheridan, Oakton, VA (US) --.

Item [57], ABSTRACT,
Lines 4 and 6, delete "Space" and insert -- space --;
Line 9, delete "Space to another Space" and insert -- space to another space --.

Signed and Sealed this

Twentieth Day of August, 2002

*Attest:*

JAMES E. ROGAN
*Attesting Officer*  *Director of the United States Patent and Trademark Office*